United States Patent
Chung et al.

(10) Patent No.: US 10,698,013 B2
(45) Date of Patent: Jun. 30, 2020

(54) LOCK-IN AMPLIFIER, INTEGRATED CIRCUIT AND PORTABLE MEASUREMENT DEVICE INCLUDING THE SAME

(71) Applicant: Samsung Electronics Co., Ltd., Suwon-si, Gyeonggi-do (KR)

(72) Inventors: Dae-Young Chung, Seoul (KR); Jae-Jin Park, Seongnam-si (KR); Dong-Hyuk Lim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 681 days.

(21) Appl. No.: 15/360,196

(22) Filed: Nov. 23, 2016

(65) Prior Publication Data

US 2017/0153279 A1    Jun. 1, 2017

(30) Foreign Application Priority Data

Nov. 27, 2015  (KR) .................. 10-2015-0167666
Dec. 11, 2015  (KR) .................. 10-2015-0176565

(51) Int. Cl.
  *G01R 19/00*    (2006.01)
  *G01R 23/02*    (2006.01)
  (Continued)

(52) U.S. Cl.
  CPC ......... *G01R 23/02* (2013.01); *G01R 19/0007* (2013.01); *H03D 3/007* (2013.01);
  (Continued)

(58) Field of Classification Search
  CPC .... G01R 23/02; G01R 19/0007; H03D 3/007; H03F 3/04; H03F 3/45475; H03F 2200/165; H03F 2200/261; H03F 2200/294; H03K 5/02

USPC ......... 324/763.01, 520, 757.02, 756.07, 537, 324/555, 500, 633, 667, 674, 681, 707, 324/727, 76.11, 76.19–76.24, 324/76.39–76.52; 327/72–175, 306–333, 327/356, 202; 702/182, 124–127, 57, 65,
(Continued)

(56) References Cited

U.S. PATENT DOCUMENTS

| | | |
|---|---|---|
| 4,320,531 A | 3/1982 | Dimon |
| 4,542,346 A | 9/1985 | McNeilly |
| 5,210,484 A | 5/1993 | Remillard et al. |
| 5,406,218 A * | 4/1995 | Ishihara ............ H03D 3/20 |
| | | 329/346 |

(Continued)

FOREIGN PATENT DOCUMENTS

| | | |
|---|---|---|
| JP | H08-297086 A | 11/1996 |
| JP | 2004-041477 A | 2/2004 |
| JP | 2006-170845 A | 6/2006 |

*Primary Examiner* — Melissa J Koval
*Assistant Examiner* — Trung Nguyen
(74) *Attorney, Agent, or Firm* — Harness, Dickey & Pierce, P.L.C.

(57) ABSTRACT

A lock-in amplifier includes a clock signal generator configured to generate a first demodulation clock signal and a second demodulation clock signal having a phase difference of 90 degrees and a same demodulation frequency; and a detector configured to, based on an input signal, the first demodulation clock signal, and the second demodulation clock signal, provide an offset voltage corresponding to an offset of the lock-in amplifier in a first operation mode, and provide a first output voltage and a second output voltage, each of which correspond to a demodulation frequency component of the input signal in a second operation mode.

19 Claims, 16 Drawing Sheets

(51) Int. Cl.
  *H03D 3/00* (2006.01)
  *H03F 3/45* (2006.01)
  *H03D 7/12* (2006.01)
  *H03F 3/04* (2006.01)
  *H03K 5/02* (2006.01)

(52) U.S. Cl.
  CPC ............... *H03D 7/12* (2013.01); *H03F 3/04* (2013.01); *H03F 3/45475* (2013.01); *H03K 5/02* (2013.01); *H03F 2200/165* (2013.01); *H03F 2200/261* (2013.01); *H03F 2200/294* (2013.01)

(58) Field of Classification Search
  USPC ... 702/118; 455/127.2, 69, 522, 13.4, 115.1, 455/138, 245.1, 341, 295
  See application file for complete search history.

(56) References Cited

U.S. PATENT DOCUMENTS

| | | | |
|---|---|---|---|
| 6,426,505 B1 * | 7/2002 | Rao | G01N 21/6408 250/458.1 |
| 7,460,894 B2 | 12/2008 | Kawaguchi et al. | |
| 7,825,667 B2 * | 11/2010 | Fang | A61B 5/0507 324/637 |
| 8,180,309 B2 | 5/2012 | Kimmig et al. | |
| 8,860,505 B2 | 10/2014 | Hafizovic et al. | |
| 2011/0074476 A1 | 3/2011 | Heer et al. | |
| 2014/0147928 A1 | 5/2014 | Steinebach | |
| 2015/0070704 A1 | 3/2015 | Bruyant et al. | |
| 2015/0305626 A1 * | 10/2015 | Deane | A61B 5/7228 433/27 |
| 2016/0301367 A1 * | 10/2016 | Hu | G01J 3/28 |

\* cited by examiner

LOCK-IN AMPLIFIER, INTEGRATED CIRCUIT AND PORTABLE MEASUREMENT DEVICE INCLUDING THE SAME

CROSS-REFERENCE TO RELATED APPLICATION

This U.S. Non-provisional application claims priority under 35 USC § 119 to Korean Patent Application No. 10-2015-0167666, filed on Nov. 27, 2015, and Korean Patent Application No. 10-2015-0176565, filed on Dec. 11, 2015 in the Korean Intellectual Property Office (KIPO), the disclosures of each of which are incorporated by reference in their entirety herein.

BACKGROUND

1. Technical Field

Example embodiments relate generally to semiconductor integrated circuits, and more particularly to a lock-in amplifier, an integrated circuit and a portable measurement device including the lock-in amplifier.

2. Discussion of the Related Art

In case of an AC signal having a very small amplitude, an amplification of the AC signal is required for measurement of the signal. The noise is amplified together with the AC small signal and thus noise filtering is typically accompanied with the signal amplification. A band-pass filter (BPF) may be used for detection of a particular frequency component. In this case, the noise remains in the pass band of the BPF and the small signal is buried in the noise. In addition, it is difficult to design a BPF having a sufficiently-narrow pass band.

SUMMARY

According to at least some example embodiments of the inventive concepts, a lock-in amplifier includes a clock signal generator configured to generate a first demodulation clock signal and a second demodulation clock signal having a phase difference of 90 degrees and a same demodulation frequency; and a detector configured to, based on an input signal, the first demodulation clock signal, and the second demodulation clock signal, provide an offset voltage corresponding to an offset of the lock-in amplifier in a first operation mode, and provide a first output voltage and a second output voltage, each of which correspond to a demodulation frequency component of the input signal in a second operation mode.

According to at least some example embodiments of the inventive concepts, an integrated circuit includes a clock signal generator configured to generate a first demodulation clock signal and a second demodulation clock signal having a phase difference of 90 degrees and a same demodulation frequency; a detector configured to, based on an input signal, the first demodulation clock signal, and the second demodulation clock signal, provide an offset voltage corresponding to an offset of the lock-in amplifier in a first operation mode, and provide a first output voltage and a second output voltage, each of which correspond to a demodulation frequency component of the input signal in a second operation mode; an analog-to-digital converter configured to convert the offset voltage, the first output voltage and the second output voltage to digital values, respectively; and a controller configured to, control the clock signal generator, the detector and the analog-to-digital converter, and calculate a magnitude of the demodulation frequency component of the input signal based on the digital values.

According to at least some example embodiments of the inventive concepts, a portable measurement circuit includes a modulator configured to generate a modulation signal based on a modulation clock signal; a sensor configured to generate an input signal by sensing a signal that is generated by an interaction of the modulation signal with an object; a clock signal generator configured to generate a first demodulation clock signal and a second demodulation clock signal having a phase difference of 90 degrees and a same demodulation frequency; a detector configured to, based on the input signal, the first demodulation clock signal and the second demodulation clock signal, provide an offset voltage corresponding to an offset in a first operation mode, and provide a first output voltage and a second output voltage, each of which correspond to a demodulation frequency component of the input signal in a second operation mode; an analog-to-digital converter configured to convert the offset voltage, the first output voltage and the second output voltage to digital values, respectively; and a controller configured to, control the clock signal generator, the detector and the analog-to-digital converter, and calculate a magnitude of the demodulation frequency component of the input signal based on the digital values.

According to at least some example embodiments of the inventive concepts, a lock-in amplifier includes a clock signal generator configured to generate a first demodulation clock signal and a second demodulation clock signal such that the first demodulation clock signal and a second demodulation clock signal have a phase difference of 90 degrees and have a same frequency; and a detector including an amplification circuit, the detector being configured to, receive an input signal, generate an offset voltage while the lock-in amplifier is in a first operation mode, and use the input signal, the first demodulation clock signal, and the second demodulation clock signal to generate a first output voltage and a second output voltage while the lock-in amplifier is in a second operation mode such that the first output voltage and a second output voltage both correspond to a demodulation frequency component of the input signal, the detector being configured to block the input signal from being provided to the amplification circuit while the lock-in amplifier is in the first operation mode such that the offset voltage is a voltage output by the detector while the input signal is blocked.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
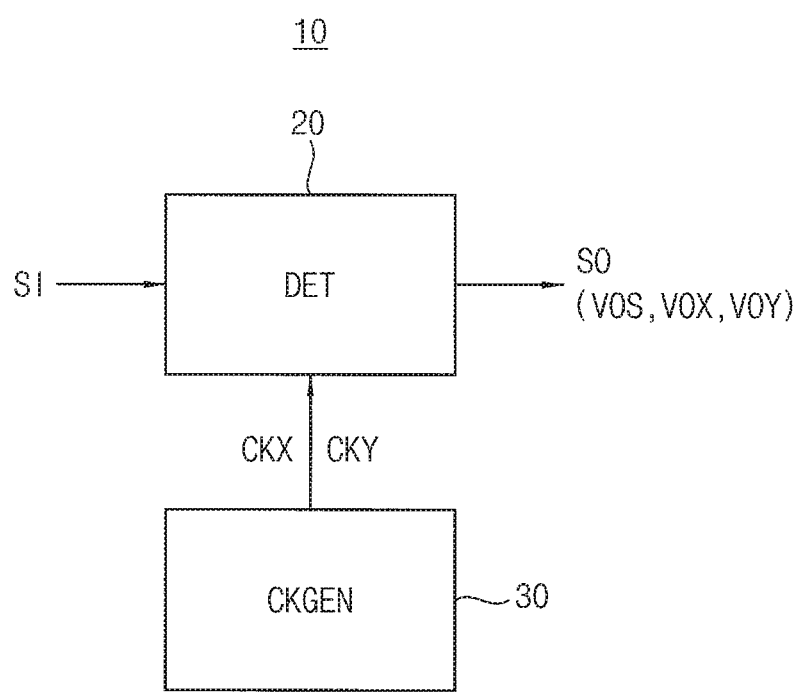
FIG. 1 is a block diagram illustrating a lock-in amplifier according to example embodiments.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a lock-in amplifier according to example embodiments.

Referring to FIG. 1, a lock-in amplifier 10 may include a detector DET 20 and a clock signal generator CKGEN 30.

The clock signal generator 30 may generate a first demodulation clock signal CKX and a second demodulation clock signal CKY having a phase difference of 90 degrees and a same demodulation frequency. In some example embodiments, the clock signal generator 30 may generate the first demodulation clock signal CKX and the second demodulation clock signal CKY using a plurality of flip-flops. Example embodiments of the clock signal generator 30 will be described below with reference to FIGS. 13 through 18.

The detector 20 may generate an output signal SO based on an input signal SI, the first demodulation clock signal CKX and the second demodulation clock signal CKY. The detector 20 may provide an offset voltage VOS, a first output voltage VOX and a second output voltage VOY through the output signal SO. The detector 20 may provide the offset voltage VOS corresponding to an offset of the lock-in amplifier 10 in a first operation mode OM1 and provide the first output voltage VOX and the second output voltage VOY corresponding to a demodulation frequency component of the input signal SI in a second operation mode OM2.

In some example embodiments, as will be described with reference to FIGS. 6 and 9, the detector 20 may provide the offset voltage VOS, the first output voltage VOX and the second output voltage VOY sequentially through a single signal channel including one mixer. In other example embodiments, as will be described with reference to FIGS. 11 and 12, the detector 20 may provide a first offset voltage VOSX of the offset voltage VOS and the first output voltage VOX sequentially through a first signal channel including a first mixer and provide a second offset voltage VOSY of the offset voltage VOS and the second output voltage VOY sequentially through a second signal channel including a second mixer.

A conventional lock-in amplifier includes a tunable phase shifting circuit and a feedback circuit for phase lock-in with the demodulation frequency component of the input signal SI and such circuits increase size and complexity of the lock-in amplifier. In addition, the conventional lock-in amplifier requires trimming due to variations of manufacturing processes and operational conditions and test time and cost are increased. The lock-in amplifier according to example embodiments may detect two perpendicular components, that is, the in-phase component and the quadrature component using the two demodulation clock signals having a phase difference of 90 degrees regardless of the phase of the input signal and calculate the demodulation frequency component of the input signal based on the two detected components. Thus the conventional circuit such as the tunable phase shifting circuit and the feedback circuit for phase lock-in may be removed or omitted and size and power consumption of the lock-in amplifier may be reduced. The size and the power consumption of the lock-in amplifier may be further reduced and the lock-in amplifier may be adopted efficiently in the portable measurement device by providing the demodulation clock signals having the phase difference of 90 degrees using a plurality of flip-flops. In addition, the lock-in amplifier according to example embodiments may extract the offset voltage in the lock-in amplifier to provide the exact magnitude of the demodulation frequency component of the input signal.

Figure 2:
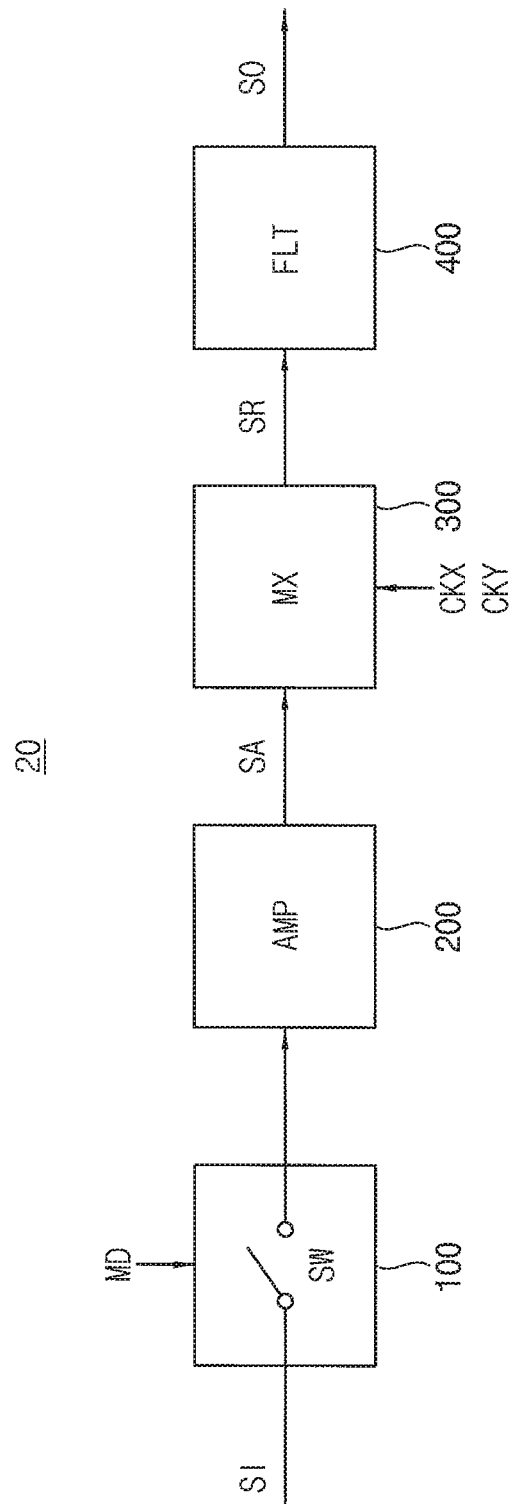
FIG. 2 is a block diagram illustrating an example embodiment of a detector included in the lock-in amplifier of FIG. 1.

FIG. 2 is a block diagram illustrating an example embodiment of a detector included in the lock-in amplifier of FIG. 1.

Referring to FIG. 2, a detector 20 may include an input circuit 100, an amplification circuit AMP 200, a mixing circuit MX 300 and a filtering circuit FLT 400.

The input circuit 100 may block the input signal SI from being applied to the amplification circuit 200 in the first operation mode OM1 in response to a mode signal MD. The input circuit 100 may include a switch SW that is turned off when the mode signal MD has a first logic level (e.g., a logic low level) and turned on when the mode signal MD has a second logic level (e.g., a logic high level). The first logic level of the mode signal MD may indicate the first operation mode OM1 and the second logic level of the mode signal MD may indicate the second operation mode OM2. The input signal SI may be blocked from being applied to the amplification circuit 200 in the first operation mode OM1 and the detector 20 may provide the offset voltage VOS through the output signal SO. In contrast, the input signal SI may be applied to the amplification circuit 200 in the second operation mode OM2 and the detector 20 may provide the first output voltage VOX and the second output voltage VOY through the output signal SO. Even though FIG. 2 illustrates that the input circuit 100 is disposed before the amplification circuit 200 as a distinct component, the input circuit 100 may be included in the amplification circuit.

The amplification circuit 200 may amplify the input signal SI to output an amplified signal SA in the second operation mode OM2. The gain of the configuration of the amplification circuit 200 may be implemented variously, for example according to the preferences of a designer or manufacturer of the lock-in amplifier 10.

The mixing circuit 300 may multiply the amplified signal SA and the first demodulation clock signal CKX to output a first rectified signal SRX of a rectified signal SR and multiply the amplified signal SA and the second demodulation clock signal CKY to output a second rectified signal SRY of the rectified signal SR in the second operation mode OM2. The filtering circuit 400 may filter the first rectified signal SRX to generate the first output voltage VOX and filter the second rectified signal SRY to generate the second output voltage VOY in the second operation mode OM2.

In some example embodiments, as will be described with reference to FIGS. 6 and 9, the mixing circuit 300 may provide the first rectified signal SRX and the second rectified signal SRY sequentially using a one mixer and the filtering circuit 400 may provide the first output voltage VOX and the second output voltage VOY sequentially using a one low pass filter. In other example embodiments, as will be described with reference to FIGS. 11 and 12, the mixing circuit 300 may provide the first rectified signal SRX and the second rectified signal SRY using two mixers respectively and the filtering circuit 400 may provide the first output voltage VOX and the second output voltage VOY respectively using two low pass filters.

Figure 3:
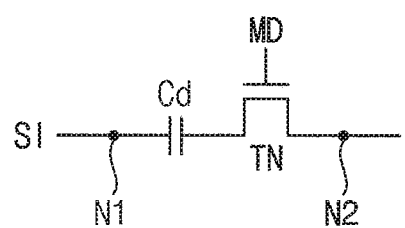
FIG. 3 is a circuit diagram illustrating an example embodiment of an input circuit included in the detector of FIG. 2.

FIG. 3 is a circuit diagram illustrating an example embodiment of an input circuit included in the detector of FIG. 2.

Referring to FIG. 3, an input circuit 100 may include a capacitor Cd and a transistor TN connected between a first node N1 receiving the input signal and a second node N2 corresponding to an input of the amplification circuit 200.

The capacitor Cd may transfer only an AC component of the input signal SI and block a DC component of the input signal SI. The transistor TN may function as a switch that is turned on and off in response to a mode signal MD. For example, the transistor TN may be implemented with a n-channel metal oxide semiconductor (NMOS) transistor. In this case, the transistor TN may be turned off in response to the logic low level of the mode signal MD to indicate the first operation mode OM1 and may be turned on in response to the logic high level of the mode signal MD to indicate the second operation mode OM2.

Figure 4:
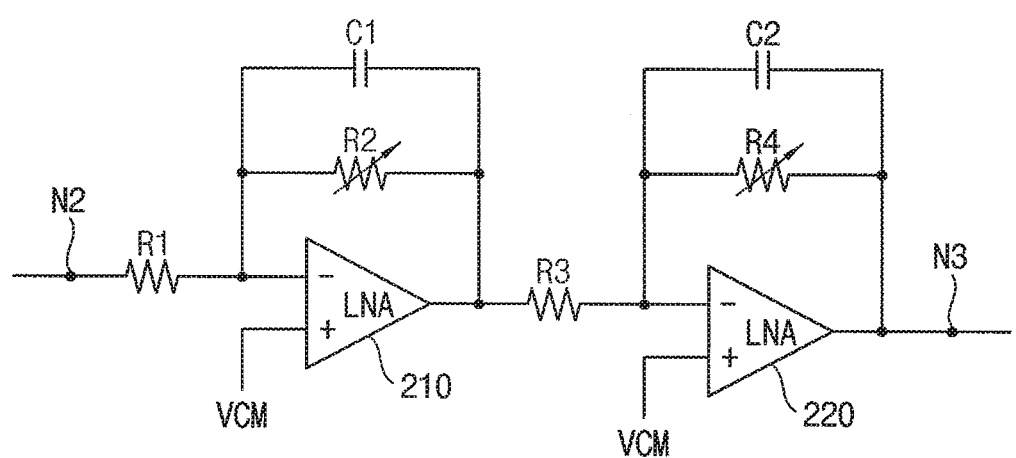
FIG. 4 is a circuit diagram illustrating an example embodiment of an amplification circuit included in the detector of FIG. 2.
Figure 5:
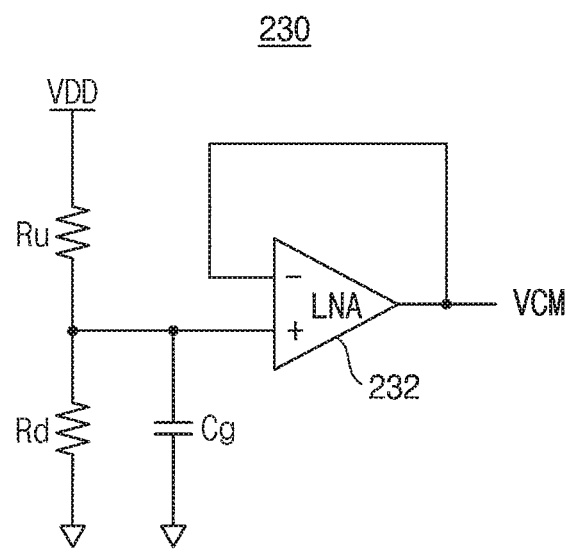
FIG. 5 is a diagram illustrating an example of a common-mode voltage generator.

FIG. 4 is a circuit diagram illustrating an example embodiment of an amplification circuit included in the detector of FIG. 2, and FIG. 5 is a diagram illustrating an example of a common-mode voltage generator.

Referring to FIG. 4, an amplification circuit 200 may include one or more operational amplifiers 210 and 220 connected between a second node N2 and a third node N3. The operational amplifiers 210 and 220 may be implemented with low noise amplifiers (LNA). Input resistors R1 and R3 may be connected to negative terminals (−) of the operational amplifiers 210 and 220 respectively and a common mode voltage VCM may be applied to positive terminals (+) of the operational amplifiers 210 and 220. Each of capacitors C1 and C2 and each of feedback resistors R2 and R4 may be connected in parallel on feedback paths respectively. The feedback resistors R2 and R4 may be implemented as variable resistors and the gain of the amplification circuit 200 may be adjusted by changing the resistance values of the feedback resistors R2 and R4. FIG. 4 illustrates a non-limiting example that the amplification circuit 200 is implemented as the two stages, the stage number and the configuration of the amplification circuit 200 may be implemented variously.

Referring to FIG. 5, a common mode voltage generator 230 may include division resistors Ru and Rd, a capacitor Cg and an operational amplifier 232. The operational amplifier 232 may be implemented with a low noise amplifier LNA. The division resistors Ru and Rd may be connected in series between a power supply voltage VDD and a ground node. A negative terminal (−) of the operational amplifier 232 may be connected to an output terminal generating a common mode voltage VCM and a positive terminal (+) of the operational amplifier 232 may be connected to a node between the division resistors Ru and Rd. The capacitor Cg may be connected between the positive terminal (+) of the operational amplifier 232 and the ground node.

The operational amplifier 232 may operate as a unity-gain amplifier and provide a division voltage by the division resistors Ru and Rd as the common mode voltage VCM. For example, the resistance values of the division resistors Ru and Rd may be the same and the common mode voltage VCM may correspond to a half VDD/2 of the power supply voltage VDD.

Figure 6:
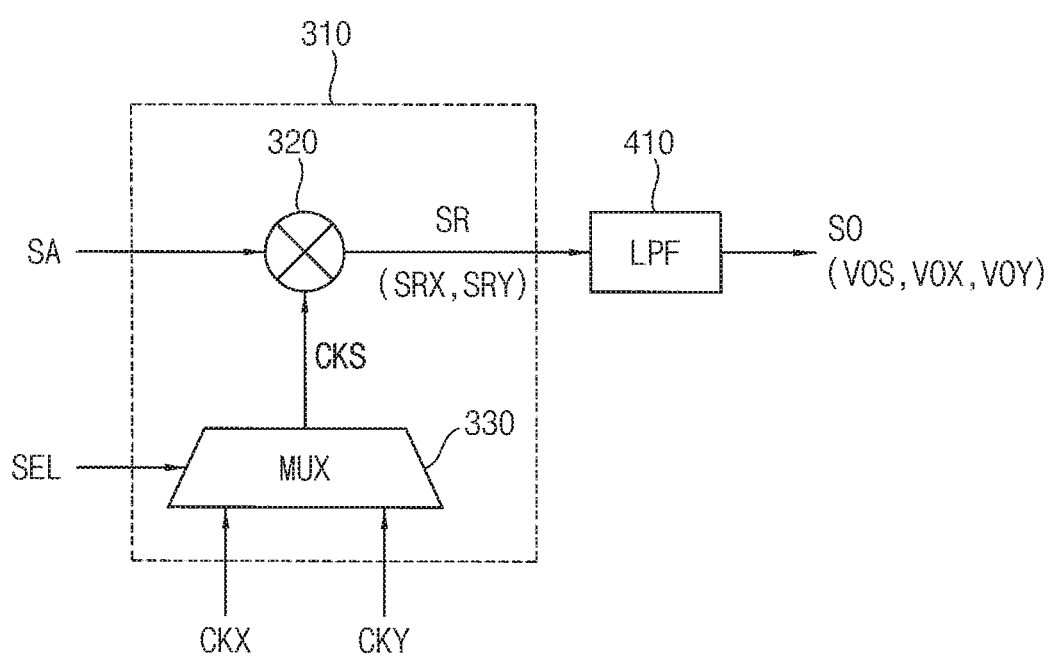
FIG. 6 is a diagram illustrating an example embodiment of a mixing circuit and a filtering circuit included in the detector of FIG. 2.

FIG. 6 is a diagram illustrating an example embodiment of a mixing circuit and a filtering circuit included in the detector of FIG. 2.

FIG. 6 illustrates a configuration of a single signal channel according to an example embodiment. Referring to FIG. 6, a mixing circuit 310 may include a one mixer 320 and a clock selector MUX 330, and a filtering circuit 410 may include a low pass filter LPF. The filtering circuit 410 may also be referred to herein as "low pass filter 410."

The mixer 320 may have a first input terminal receiving the amplified signal SA, a second input terminal receiving the first demodulation clock signal CKX and the second demodulation clock signal CKY sequentially in the second operation mode OM2 and an output terminal outputting the first rectified signal SRX and the second rectified signal SRY sequentially in the second operation mode OM2. In other words, the first rectified signal SRX and the second rectified signal SRY may correspond to the one rectified signal SR that is provided through the one output terminal of the mixer.

The clock selector 330 may select one of the first demodulation clock signal CKX and the second demodulation clock signal CKY to provide a selected demodulation clock signal CKS to the second input terminal of the mixer 320. Even though, the clock selector 330 may be included in the mixing circuit 310 as is illustrated in FIG. 6, according to at least some example embodiments, the clock selector 330 may be included, for example, in the clock signal generator 30 in FIG. 1.

The low pass filter 410 may be connected to the output terminal of the mixer 320 to output the offset voltage VOS in the first operation mode OM1 and output the first output voltage VOX and the second output voltage VOY sequentially in the second operation mode OM2. In other words, the low pass filter 410 may provide the offset voltage VOS, the first output voltage VOX and the second output voltage VOY sequentially per operation mode (e.g., based on operation mode) through the one output signal SO. As described above, the low pass filter 410 may generate the offset voltage VOS in the first operation mode OM1 in which the input signal SI is blocked. For example, the low pass filter 410 may include one or more resistor-capacitor (RC) filters. The operation of the lock-in amplifier adopting the configuration of the single signal channel of FIG. 6 will be described below with reference to FIG. 9.

Figure 7:
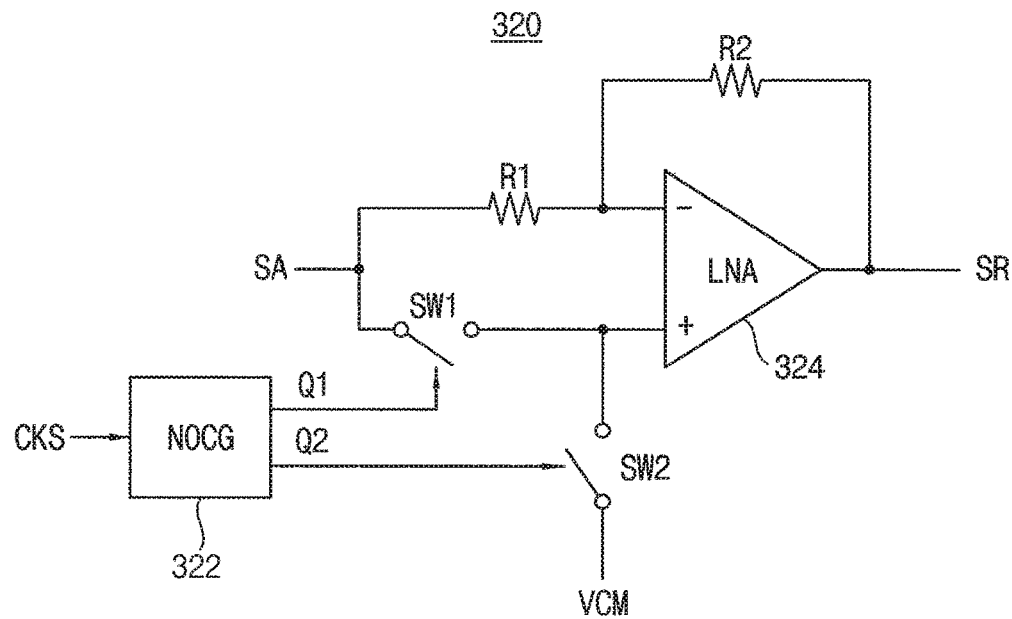
FIG. 7 is a diagram illustrating an example embodiment of a mixer included in the mixing circuit of FIG. 6.
Figure 8:
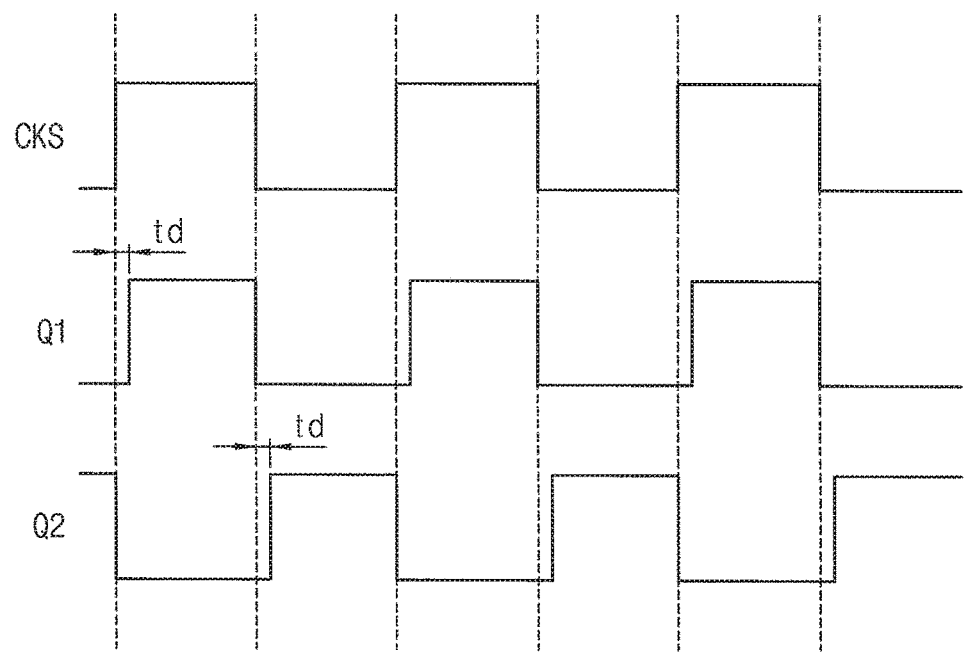
FIG. 8 is a timing diagram illustrating an example operation of a non-overlap clock generator included in the mixer of FIG. 7.

FIG. 7 is a diagram illustrating an example embodiment of a mixer included in the mixing circuit of FIG. 6, and FIG. 8 is a timing diagram illustrating an example operation of a non-overlap clock generator included in the mixer of FIG. 7.

Referring to FIG. 7, a mixer 320 may include a non-overlap clock generator NOCG 322, an operational amplifier 324, first and second resistors R1 and R2 and first and second switches SW1 and SW2. The first resistor R1 may be connected to a negative terminal (−) of the operational amplifier 324 and the second resistor R2 may be disposed on a feedback path between an output terminal generating the rectified signal SR and a negative terminal (−) of the operational amplifier 324. The first switch SW1 may apply the amplified signal SA to the positive terminal (+) of the operational amplifier 324 in response to a first clock signal Q1 from the non-overlap clock generator 322. The second switch SW2 may apply the common mode voltage VCM to the positive terminal (+) of the operational amplifier 324 in response to a second clock signal Q2 from the non-overlap clock generator 322. For example, the first resistor R1 and the second resistor R2 may have the same resistance value.

The non-overlap clock generator 322 may generate the first clock signal Q1 and the second clock signal Q2 that are activated complementarily in response to the selected clock signal CKS from the clock selector 330 in FIG. 6. As illustrated in FIG. 8, the non-overlap clock generator 322 may adjust activation timings of the first clock signal Q1 and the second clock signal Q2 such that one of the first clock signal Q1 and the second clock signal Q2 may be activated to a logic high level by a predetermined or, alternatively, desired delay time td after the other of the first clock signal Q1 and the second clock signal Q2 is deactivated to a logic low level. In other words, the non-overlap clock generator 322 may adjust the timings such that the activation time intervals of the first clock signal Q1 and the second clock signal Q2 may not overlap. As such, using the non-overlapped first and second clock signals Q1 and Q2, the amplified signal SA and the common mode voltage VCM may not be applied simultaneously to the positive terminal (+) of the operational amplifier 324.

Figure 9:
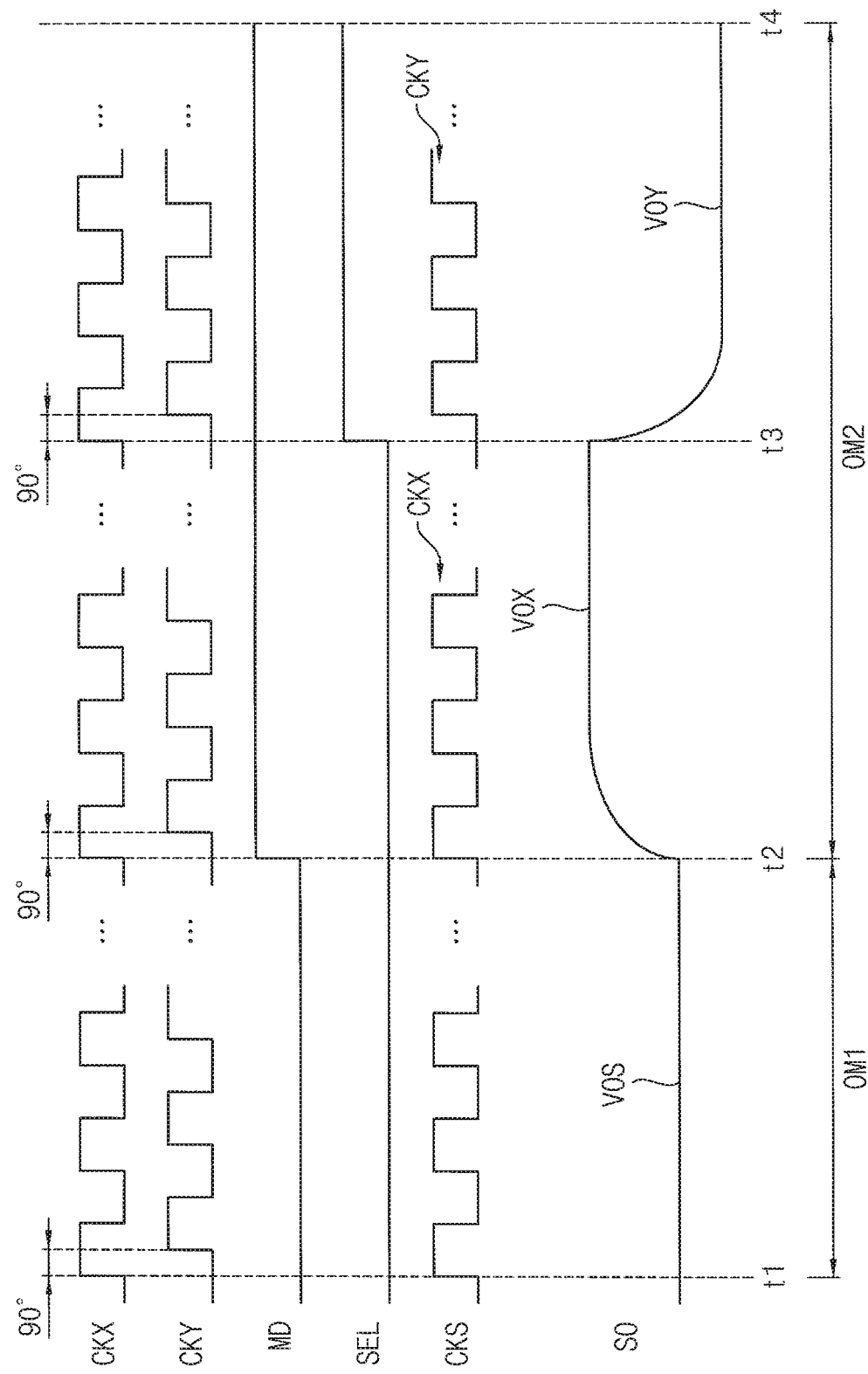
FIG. 9 is a timing diagram illustrating an example operation of a lock-in amplifier including the mixing circuit and the filtering circuit of FIG. 6.

FIG. 9 is a timing diagram illustrating an example operation of a lock-in amplifier including the mixing circuit and the filtering circuit of FIG. 6.

In FIG. 9, time interval t1~t2 corresponds to the first operation mode OM1 and time interval t2~t4 corresponds to the second operation mode OM2.

Referring to FIGS. 1, 2, 6 and 9, the detector 20 may generate the offset voltage VOS, the first output voltage VOX and the second output voltage VOY sequentially per operation mode (e.g., based on operation mode) using the one mixer 320 as described above. The clock signal generator 30 may output the first demodulation clock signal CKX and the second demodulation clock signal CKY having the phase difference of 90 degrees and the same demodulation frequency.

During time interval t1~t2, the mode signal MD may have the logic low level to indicate the first operation mode OM1 and the input circuit 100 may block the input signal SI in response to the logic low level of the mode signal MD. The clock selector 330 may select and provide the first demodulation clock signal CKX as the selected clock signal CKS in response to the logic low level of the clock selection signal SEL. FIG. 9 illustrates a non-limiting example scenario in which the first demodulation clock signal CKX is selected in the first operation mode OM1 for convenience of illustration. However, according to at least some example embodiments of the inventive concepts, the second demodulation clock signal CKY may be selected in the first operation mode OM1. The output signal SO from the low pass filter 410 while the input signal SI is blocked corresponds to the offset voltage VOS in the lock-in amplifier 10.

During time interval t2~t3, the mode signal MD may have the logic high level to indicate the second operation mode OM2 and the input circuit 100 may transfer the input signal SI to the amplification circuit 200 in response to the logic high level of the mode signal MD. The clock selector 330 may select and provide the first demodulation clock signal CKX as the selected clock signal CKS in response to the logic low level of the clock selection signal SEL. In this case, the output signal SO from the low pass filter 410 corresponds to the first output voltage VOX.

The demodulation frequency component of the input signal SI may be represented by $Vi*\sin(wt)$ where Vi is an amplitude of the input signal SI and the first demodulation clock signal CKX may be represented by $Vd*\sin(wt+\theta)$ where Vd is an amplitude of the first demodulation clock signal CKX. In this case, the first rectified signal SRX generated from the mixer 320 during time interval t2~t3 may be represented by Expression 1.

$$SRX = VOS + Vi*Ga*Vd*\sin(wt)*\sin(wt+\theta) \quad \text{Expression 1}$$
$$= VOS + (1/2)*Vi*Ga*Vd*\cos(\theta) - (1/2)*$$
$$Vi*Ga*Vd*\cos(2\ wt+\theta)$$

In Expression 1, Ga indicates a gain of the amplification circuit 200, θ indicates the phase difference between the demodulation frequency component of the input signal SI and the first demodulation clock signal CKX, w indicates an angular frequency corresponding to the demodulation frequency, and t indicates a time. The time-dependent component of the first rectified signal SRX is removed by the low pass filter 410 and thus the first output voltage VOX may be represented by Expression 2.

$$VOX = VOS + (½)*Vi*Ga*Vd*\cos(\theta) \quad \text{Expression 2}$$

During time interval t3~t4, the mode signal MD may have the logic high level to indicate the second operation mode OM2 and the input circuit 100 may transfer the input signal SI to the amplification circuit 200 in response to the logic high level of the mode signal MD. The clock selector 330 may select and provide the second demodulation clock signal CKY as the selected clock signal CKS in response to the logic high level of the clock selection signal SEL. In this case, the output signal SO from the low pass filter 410 corresponds to the second output voltage VOY.

The second demodulation clock signal CKY has the phase difference of 90 degrees with the first demodulation clock signal CKX and the second demodulation clock signal CKY may be represented by Vd*cos(wt+θ). In this case, the second rectified signal SRY generated from the mixer 320 during time interval t3~t4 may be represented by Expression 3.

$$SRY = VOS + Vi*Ga*Vd*\sin(wt)*\cos(wt+\theta) \quad \text{Expression 3}$$
$$= VOS + (1/2)*Vi*Ga*Vd*\sin(\theta) + (1/2)*$$
$$Vi*Ga*Vd*\sin(2\ wt+\theta)$$

The time-dependent component of the second rectified signal SRY is removed by the low pass filter 410 and thus the second output voltage VOY may be represented by Expression 4.

$$VOY = VOS + (½)*Vi*Ga*Vd*\sin(\theta) \quad \text{Expression 4}$$

The demodulation frequency component of the input signal SI may be obtained from Expression 2 and Expression 4 and may be represented by Expression 5.

$$Vo = [(VOX - VOS)^2 + (VOY - VOS)^2]^{1/2} \quad \text{Expression 5}$$
$$= (1/2)*Vi*Ga*Vd$$

As such, the lock-in amplifier according to example embodiments may generate the first output voltage VOX and the second output voltage VOY sequentially per operation mode (e.g., based on operation mode) using the single signal channel including the one mixer 320, thereby preventing mismatch between multiple channels and providing the exact magnitude Vo of the demodulation frequency component of the input signal SI.

Figure 10:
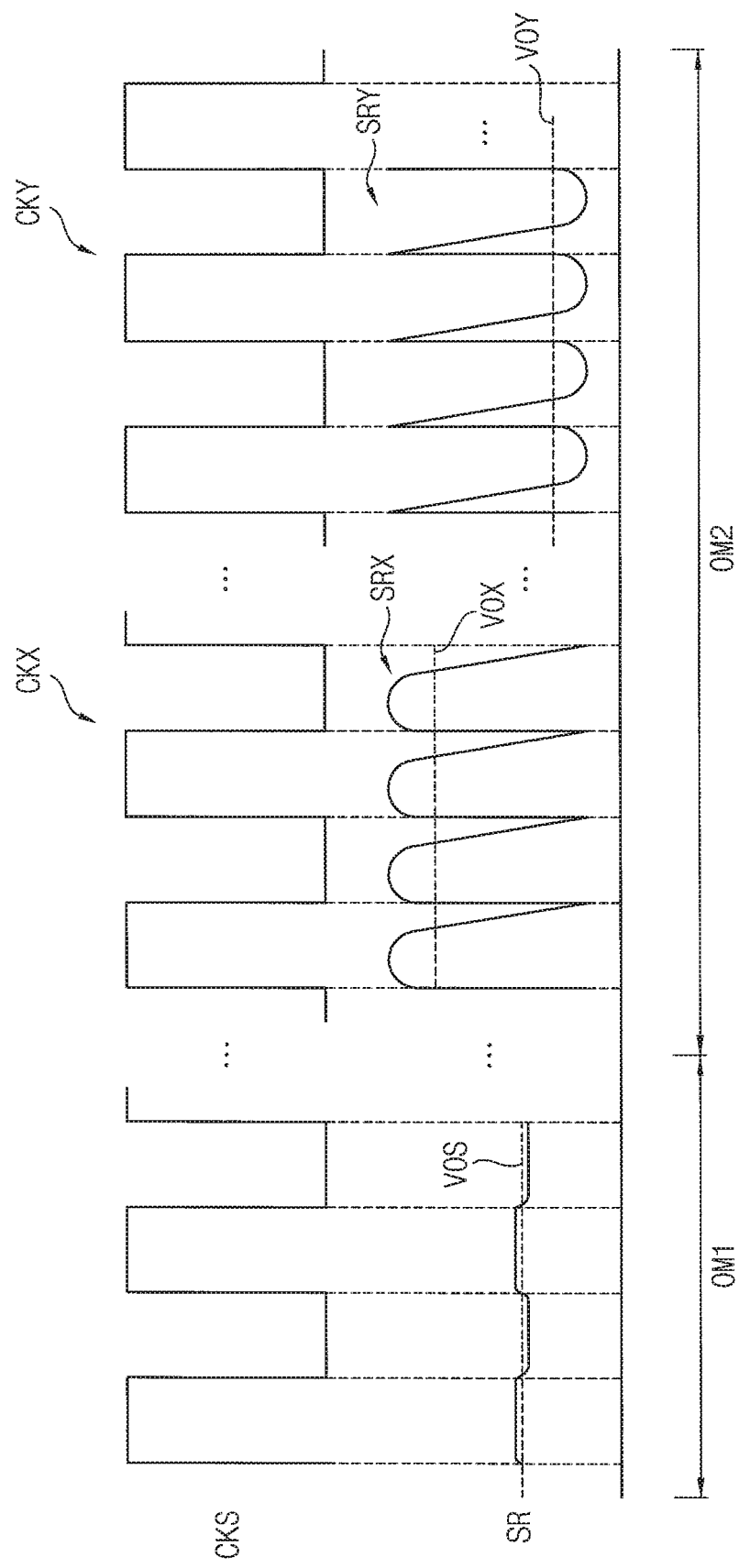
FIG. 10 is a waveform diagram illustrating an example of a rectified signal output from a mixer.

FIG. 10 is a waveform diagram illustrating an example of a rectified signal output from a mixer.

Referring to FIG. 10, the rectified signal SR in the first operation mode OM1 is substantially a DC voltage and the effective voltage of the rectified signal SR corresponds to the offset voltage VOS. It does not matter whether the selected clock signal CKS is the first demodulation clock signal CKX or the second demodulation clock signal CKY.

In the second operation mode OM2, the first demodulation clock signal CKX and the second demodulation clock signal CKY are selected sequentially as the selected clock signal CKS. The rectified signal SR when the first demodulation clock signal CKX is provided as the selected clock signal CKS corresponds to the first rectified signal SRX and the rectified signal SR when the second demodulation clock signal CKY is provided as the selected clock signal CKS corresponds to the second rectified signal SRY. The waveform of the first rectified signal SRX is different from the waveform of the second rectified signal SRY because the first demodulation clock signal CKX and the second demodulation clock signal CKY have the phase difference of 90 degrees. The effective voltage of the first rectified signal SRX corresponds to the first output voltage VOX and the effective voltage of the second rectified signal SRY corresponds to the second output voltage VOY.

Figure 11:
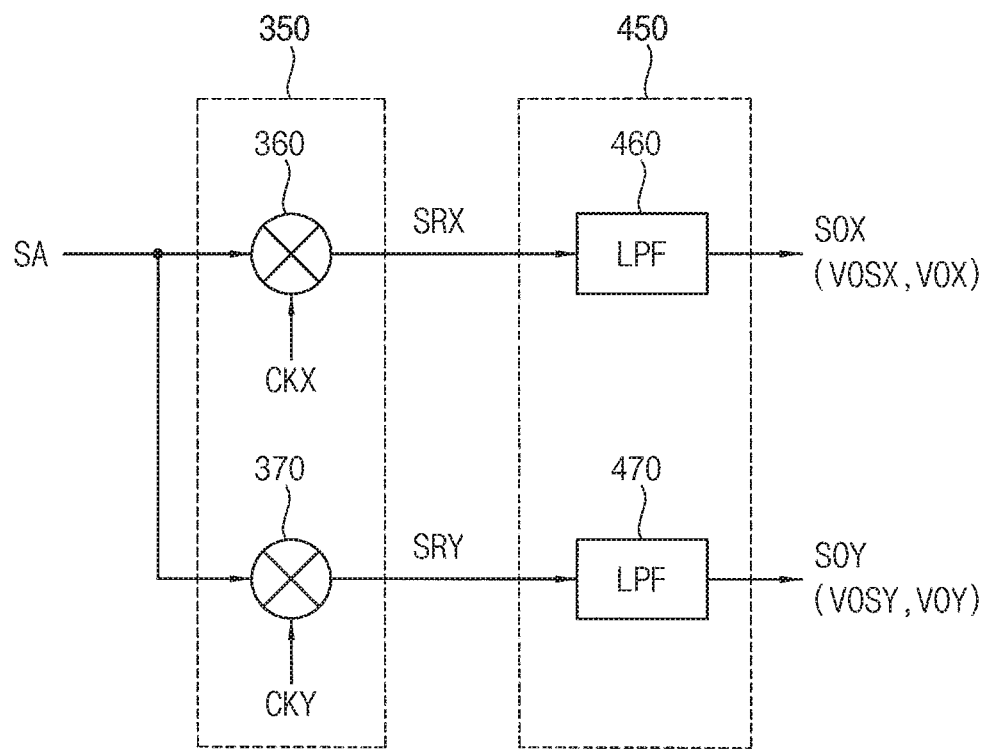
FIG. 11 is a diagram illustrating an example embodiment of a mixing circuit and a filtering circuit included in the detector of FIG. 2.

FIG. 11 is a diagram illustrating an example embodiment of a mixing circuit and a filtering circuit included in the detector of FIG. 2.

FIG. 11 illustrates a configuration of double single signal channels according to an example embodiment. Referring to FIG. 11, a mixing circuit 350 may include a first mixer 360 and a second mixer 370, and a filtering circuit 450 may include a first low pass filter LPF 460 and a second low pass filter 470.

The first mixer 360 may have a first input terminal receiving the amplified signal SA, a second input terminal receiving the first demodulation clock signal CKX and a first output terminal outputting the first rectified signal SRX. The second mixer 370 may have a third input terminal receiving the amplified signal SA, a fourth input terminal receiving the second demodulation clock signal CKY and a second output terminal outputting the second rectified signal SRY.

The first low pass filter 460 may be connected to the first output terminal of the first mixer 360 to output the first offset voltage VOSX in the first operation mode OM1 and output the first output voltage VOX in the second operation mode OM2. In other words, the first low pass filter 460 may provide the first offset voltage VOSX and the first output voltage VOX sequentially per operation mode (e.g., based on operation mode) through the first output signal SOX. The second low pass filter 470 may be connected to the second output terminal of the second mixer 370 to output the second offset voltage VOSY in the first operation mode OM1 and output the second output voltage VOY in the second operation mode OM2. In other words, the second low pass filter 470 may provide the second offset voltage VOSY and the second output voltage VOY sequentially per operation mode (e.g., based on operation mode) through the second output signal SOY.

Figure 12:
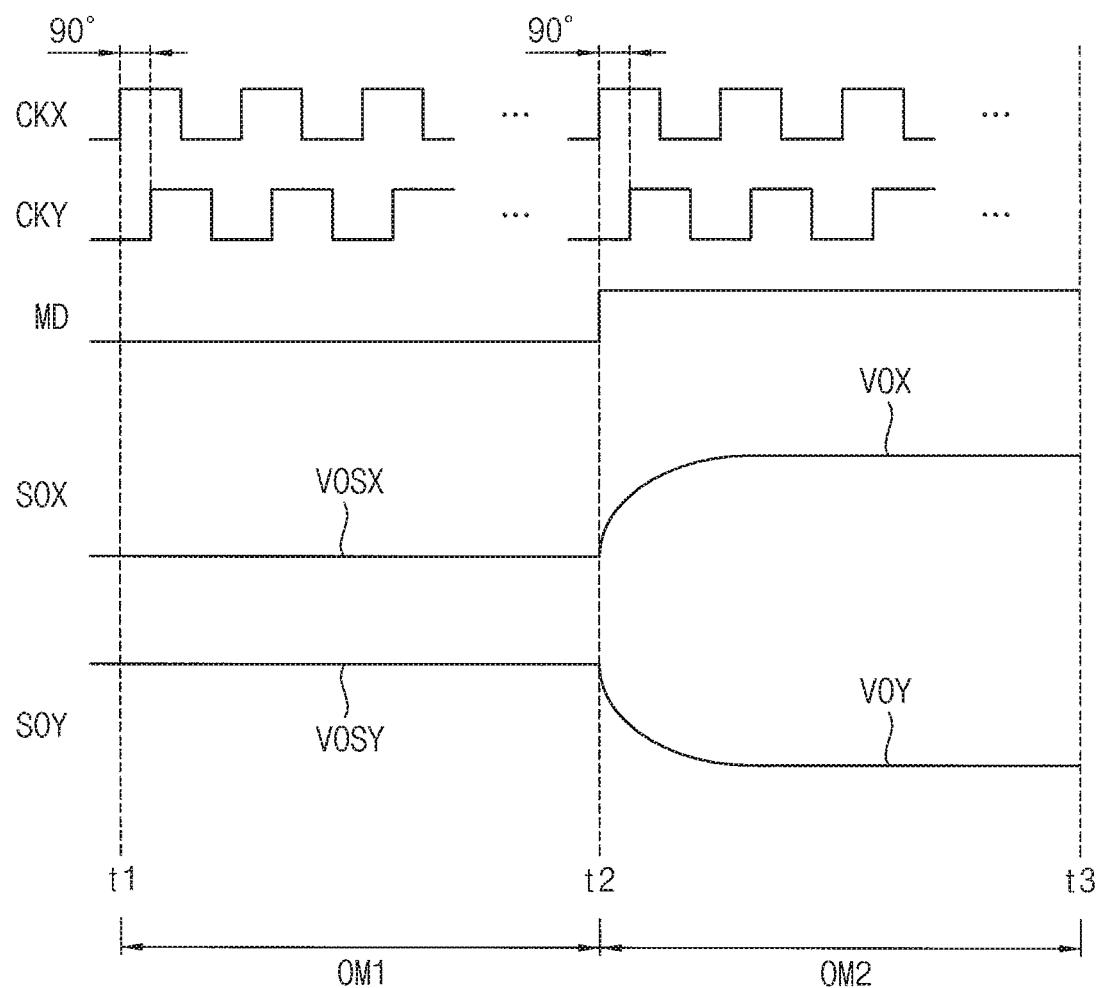
FIG. 12 is a timing diagram illustrating an example operation of a lock-in amplifier including the mixing circuit and the filtering circuit of FIG. 11.

FIG. 12 is a timing diagram illustrating an example operation of a lock-in amplifier including the mixing circuit and the filtering circuit of FIG. 11.

In FIG. 12, time interval t1~t2 corresponds to the first operation mode OM1 and time interval t2~t3 corresponds to the second operation mode OM2.

Referring to FIGS. 1, 2, 11 and 12, the detector 20 may generate the first offset voltage VOSX and the first output voltage VOX sequentially per operation mode (e.g., based on operation mode) using the first mixer 360 and generate the second offset voltage VOSY and the second output voltage VOY sequentially per operation mode (e.g., based on operation mode) using the second mixer 370 as described above. The clock signal generator 30 may output the first demodulation clock signal CKX and the second demodulation clock signal CKY having the phase difference of 90 degrees and the same demodulation frequency.

During time interval t1~t2, the mode signal MD may have the logic low level to indicate the first operation mode OM1 and the input circuit 100 may block the input signal SI in response to the logic low level of the mode signal MD. The first output signal SOX from the first low pass filter 460 while the input signal SI is blocked corresponds to the first offset voltage VOSX in the first signal channel including the amplification circuit 200, the first mixer 360 and the first low pass filter 460. The second output signal SOY from the second low pass filter 470 while the input signal SI is blocked corresponds to the second offset voltage VOSY in the second signal channel including the amplification circuit 200, the second mixer 370 and the second low pass filter 470.

During time interval t2~t3, the mode signal MD may have the logic high level to indicate the second operation mode OM2 and the input circuit 100 may transfer the input signal SI to the amplification circuit 200 in response to the logic high level of the mode signal MD. In this case, the first output signal SOX from the first low pass filter 460 corresponds to the first output voltage VOX and the second output signal SOY from the second low pass filter 470 corresponds to the second output voltage VOY.

As described above, the demodulation frequency component of the input signal SI may be represented by $Vi*\sin(wt)$ where $Vi$ is an amplitude and the first demodulation clock signal CKX may be represented by $Vd*\sin(wt+\theta)$ where $Vd$ is an amplitude. In this case, the first rectified signal SRX generated from the first mixer 360 during time interval t2~t3 may be represented by Expression 6.

$$SRX = VOSX + Vi*Ga*Vd*\sin(wt)*\sin(wt+\theta) \quad \text{Expression 6}$$
$$= VOSX + (1/2)*Vi*Ga*Vd*\cos(\theta) -$$
$$(1/2)*Vi*Ga*Vd*\cos(2\ wt+\theta)$$

In Expression 6, Ga indicates a gain of the amplification circuit 200, θ indicates the phase difference between the demodulation frequency component of the input signal SI and the first demodulation clock signal CKX, w indicates an angular frequency corresponding to the demodulation frequency, and t indicates a time. The time-dependent component of the first rectified signal SRX is removed by the first low pass filter 460 and thus the first output voltage VOX may be represented by Expression 7.

$$VOX=VOSX+(½)*Vi*Ga*Vd*\cos(\theta) \quad \text{Expression 7}$$

As described above, the second demodulation clock signal CKY has the phase difference of 90 degrees with the first demodulation clock signal CKX and the second demodulation clock signal CKY may be represented by $Vd*\cos(wt+\theta)$. In this case, the second rectified signal SRY generated from the second mixer 370 during time interval t2~t3 may be represented by Expression 8.

$$SRY = VOSY + Vi*Ga*Vd*\sin(wt)*\cos(wt+\theta) \quad \text{Expression 8}$$
$$= VOS + (1/2)*Vi*Ga*Vd*\sin(\theta) -$$
$$(1/2)*Vi*Ga*Vd*\sin(2\ wt+\theta)$$

The time-dependent component of the second rectified signal SRY is removed by the second low pass filter 470 and thus the second output voltage VOY may be represented by Expression 9.

$$VOY=VOSY+(½)*Vi*Ga*Vd*\sin(\theta) \quad \text{Expression 9}$$

The demodulation frequency component of the input signal SI may be obtained from Expression 7 and Expression 9 and may be represented by Expression 10.

$$Vo = [(VOX - VOSX)^2 + (VOY - VOSY)^2]^{1/2} \quad \text{Expression 10}$$
$$= (1/2)*Vi*Ga*Vd$$

As such, the lock-in amplifier according to example embodiments may detect the two perpendicular components, that is, the in-phase component VOX and the quadrature component VOY using the two demodulation clock signals CKX and CKY having the phase difference of 90 degrees regardless of the phase of the input signal SI and calculate the magnitude Vo of the demodulation frequency component of the input signal SI based on the two detected components VOX and VOY. Thus the conventional circuit such as the tunable phase shifting circuit and the feedback circuit for phase lock-in may be removed or omitted and size and power consumption of the lock-in amplifier may be reduced. In addition, the lock-in amplifier according to example embodiments may extract the offset voltages VOSX and VOSY in the lock-in amplifier to provide the exact magnitude Vo of the demodulation frequency component of the input signal SI.

In some example embodiments, the clock signal generator 30 in FIG. 1 may include a plurality of flip-flops configured to generate the first demodulation clock signal CKX and the second demodulation clock signal CKY based on a reference clock signal CKR having a frequency corresponding to N times the demodulation frequency. In some example embodiments, as will be described below with reference to FIGS. 13, 14 and 15, the clock signal generator may include three flip-flops generating the first demodulation clock signal CKX and the second demodulation clock signal CKY based on the reference clock signal CKR having a frequency corresponding to four times the demodulation frequency. In other example embodiments, as will be described below with reference to FIGS. 16 and 17, the clock signal generator may include two flip-flops generating the first demodulation clock signal CKX and the second demodulation clock signal CKY based on the reference clock signal CKR having a frequency corresponding to two times the demodulation frequency.

Figure 13:
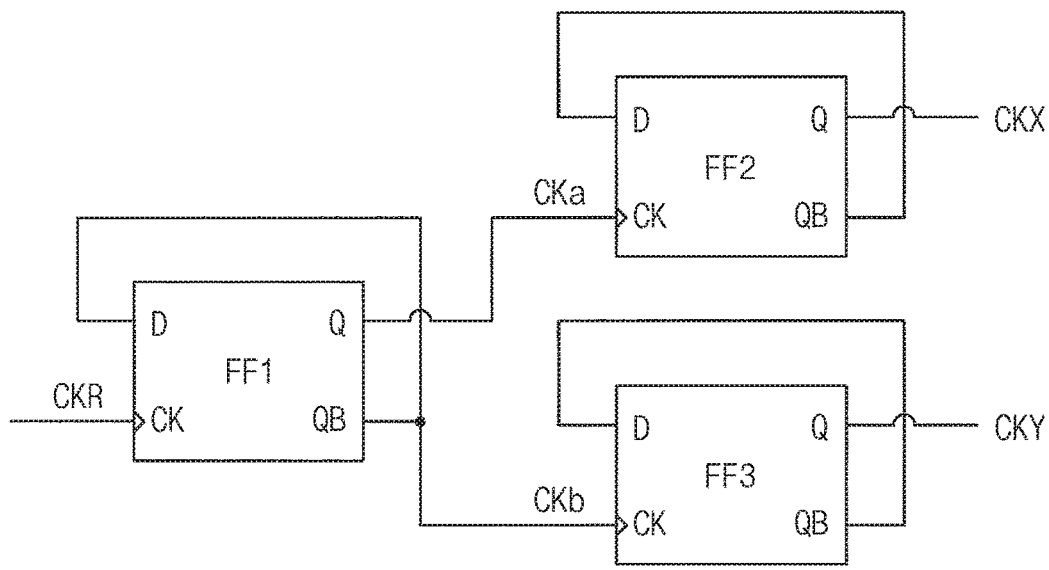
FIGS. 13 and 14 are diagrams illustrating example embodiments of a clock signal generator included in the lock-in amplifier of FIG. 1.
Figure 14:
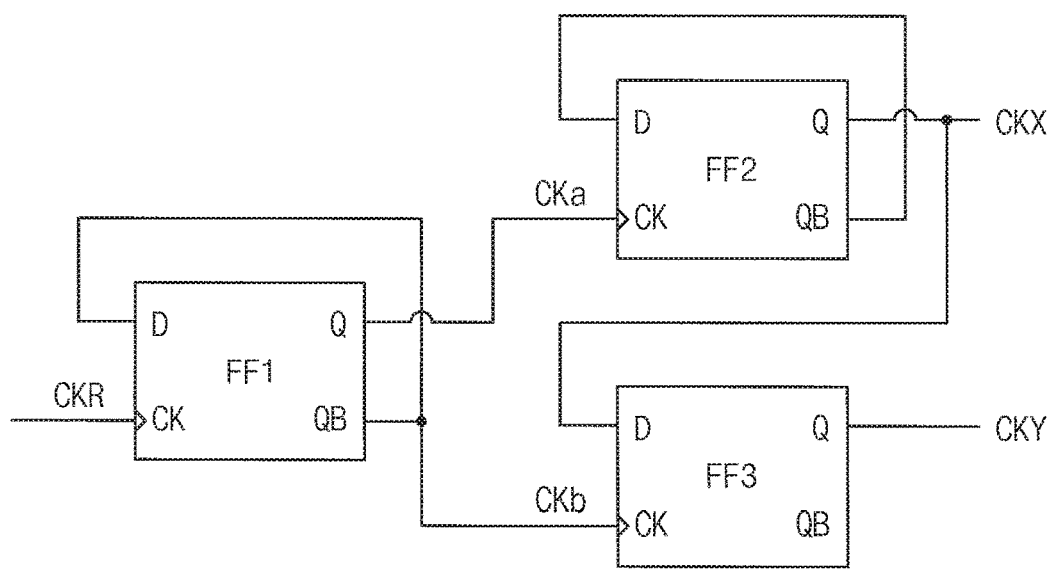
Figure 15:
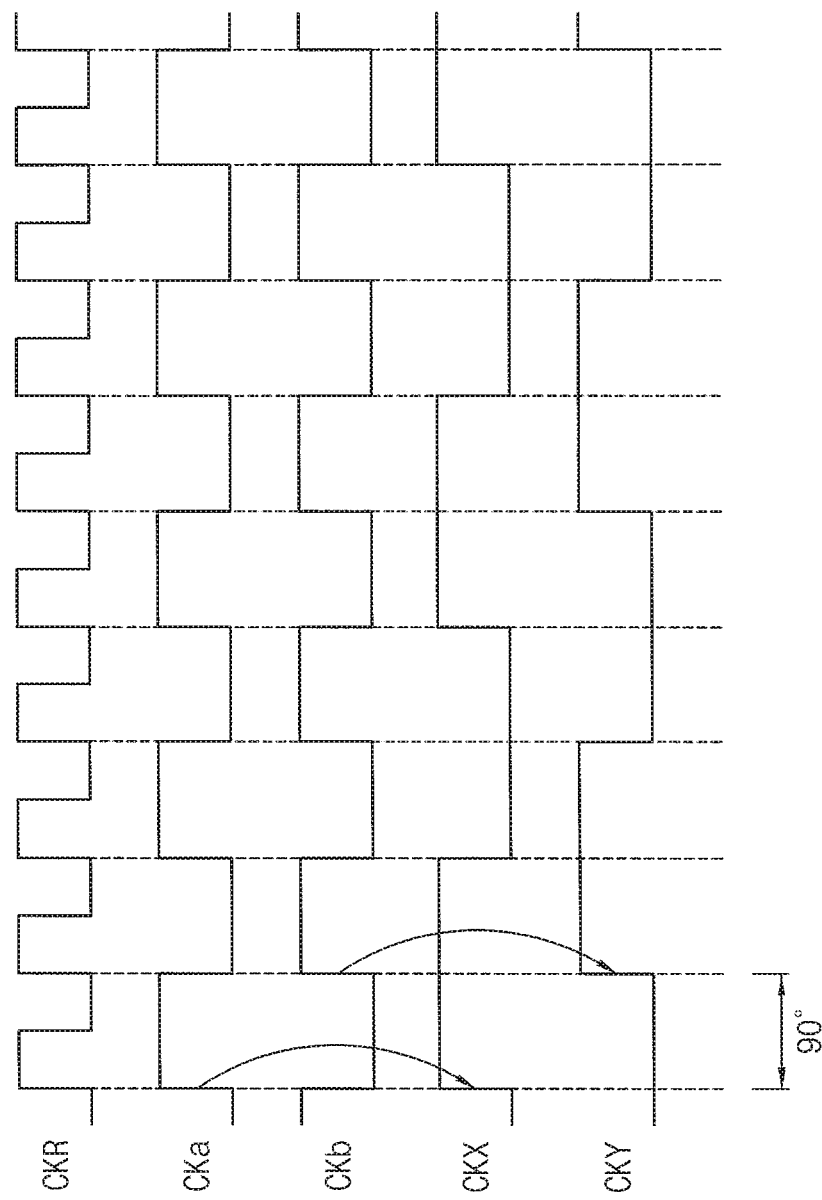
FIG. 15 is a timing diagram illustrating an operation of the clock signal generators of FIGS. 13 and 14.

FIGS. 13 and 14 are diagrams illustrating example embodiments of a clock signal generator included in the lock-in amplifier of FIG. 1, and FIG. 15 is a timing diagram illustrating an operation of the clock signal generators of FIGS. 13 and 14.

Referring to FIG. 13, a clock signal generator 31 may include a first flip-flop FF1, a second flip-flop FF2 and a third flip-flop FF3.

The first flip-flop FF1 may have a clock terminal CK receiving a reference clock signal CKR, a non-inversion output terminal Q generating a first clock signal CKa, an inversion output terminal QB generating a second clock signal CKb and a data terminal D connected to the inversion output terminal QB.

The second flip-flop FF2 may have a clock terminal CK receiving the first clock signal CKa, a non-inversion output terminal Q generating the first demodulation clock signal CKX, an inversion output terminal QB and a data terminal D connected to the inversion terminal QB.

The third flip-flop FF3 may have a clock terminal CK receiving the second clock signal CKb, a non-inversion output terminal Q generating the second demodulation clock signal CKY, an inversion output terminal QB and a data terminal D connected to the inversion terminal QB.

In some example embodiments, the flip-flops FF1, FF2 and FF3 may be implemented with rising-edge-triggered D flip-flops. The rising-edge-triggered D flip-flop will be described below with reference to FIG. 18.

A clock signal generator 32 in FIG. 14 is similar to the clock signal generator 31 in FIG. 13 and the repeated descriptions are omitted. While the data terminal D of the third flip-flop FF3 is connected to the inversion output terminal QB of the third flip-flop FF3 in the clock signal generator 31 in FIG. 13, the data terminal D of the third flip-flop FF3 is connected to the non-inversion terminal Q of the second flip-flop FF2.

Referring to FIGS. 13, 14 and 15, the first flip-flop FF1 may generate the first clock signal CKa and the second clock signal CKb toggling complementarily in synchronization with the rising edges of the reference clock signal CKR. The second flip-flop FF2 may generate the first demodulation clock signal CKX toggling in synchronization with the rising edges of the first clock signal CKa. The third flip-flop FF3 may generate the second demodulation clock signal CKY toggling in synchronization with the rising edges of the second clock signal CKb.

As a result, the first demodulation clock signal CKX and the second demodulation clock signal CKY may have the phase difference of 90 degrees and the frequency of the reference clock signal CKR may be four times the demodulation frequency.

Figure 16:
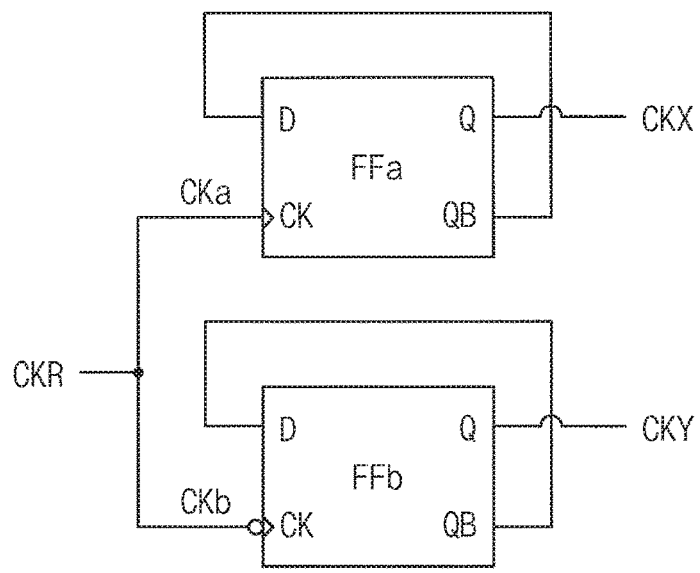
FIG. 16 is a diagram illustrating an example embodiment of a clock signal generator included in the lock-in amplifier of FIG. 1.
Figure 17:
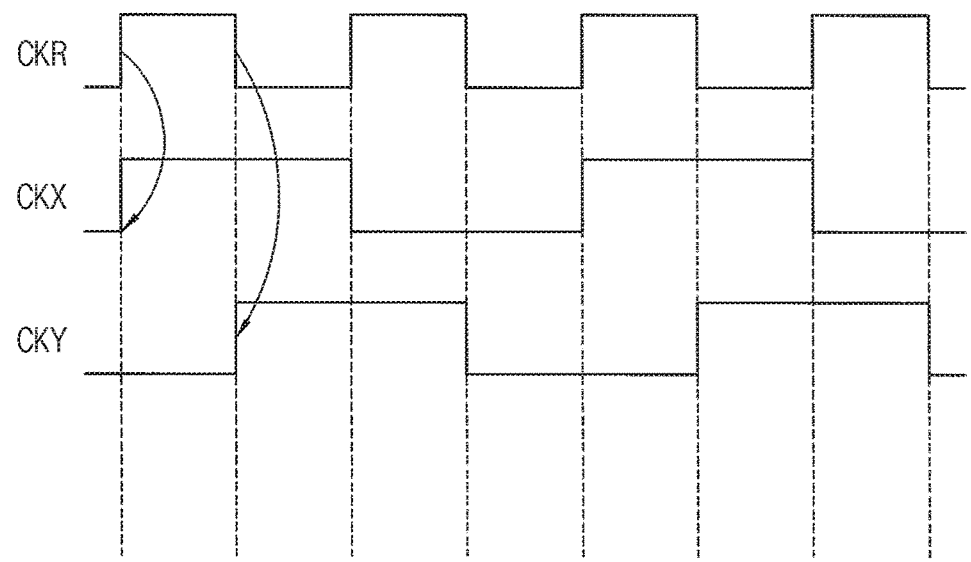
FIG. 17 is a timing diagram illustrating an operation of the clock signal generator of FIG. 16.

FIG. 16 is a diagram illustrating an example embodiment of a clock signal generator included in the lock-in amplifier of FIG. 1, and FIG. 17 is a timing diagram illustrating an operation of the clock signal generator of FIG. 16.

Referring to FIG. 16, a clock signal generator 33 may include a first flip-flop FFa and a second flip-flop FFb.

The first flip-flop FFa may have a clock terminal CK receiving a reference clock signal CKR, a non-inversion output terminal Q generating the first demodulation clock signal CKX, an inversion output terminal QB and a data terminal D connected to the inversion output terminal QB.

The second flip-flop FFb may have a clock terminal CK receiving an inversion signal of the reference clock signal CKR, a non-inversion output terminal Q generating the second demodulation clock signal CKY, an inversion output terminal QB and a data terminal D connected to the inversion terminal QB.

In some example embodiments, the first flip-flop FFa may be implemented with a rising-edge-triggered D flip-flop and the second flip-flop FFb may be implemented with a falling-edge-triggered flip-flop. The rising-edge-triggered D flip-flop and the falling-edge-triggered flip-flop will be described below with reference to FIG. 18.

Referring to FIGS. 16 and 17, the first flip-flop FFa may generate the first demodulation clock signal CKX toggling in synchronization with the rising edges of the reference clock signal CKR. The second flip-flop FFb may generate the second demodulation clock signal CKY toggling in synchronization with the falling edges of the reference clock signal CKR.

As a result, the first demodulation clock signal CKX and the second demodulation clock signal CKY may have the phase difference of 90 degrees and the frequency of the reference clock signal CKR may be two times the demodulation frequency.

Figure 18:
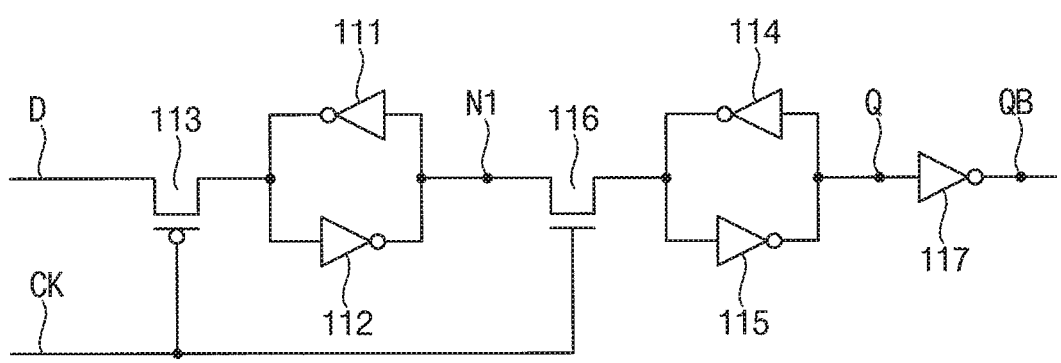
FIG. 18 is a circuit diagram illustrating an example embodiment of a flip-flop included in the clock signal generator.

FIG. 18 is a circuit diagram illustrating an example embodiment of a flip-flop included in the clock signal generator.

Referring to FIG. 18, a D flip-flop 40 may include a first inverter 111, a second inverter 112, a first switch 113, a third inverter 114, a fourth inverter 115, a second switch 116 and a fifth inverter 117.

An output of the first inverter 111 is connected to an input of the second inverter 112 and an output of the second inverter 112 is connected to an input of the first inverter 111 to have a latch configuration. An output of the third inverter 114 is connected to an input of the fourth inverter 115 and an output of the fourth inverter 115 is connected to an input of the third inverter 114 to have a latch configuration.

In the example of FIGS. 13, 14 and 16, the output of the fifth inverter 117 corresponds to the inversion output terminal QB and the output of the fourth inverter 115 corresponds to the non-inversion output terminal Q. The first switch 113 is connected between the data terminal D and the input of the second inverter 112 and control terminal of the first switch 113 corresponds to the clock terminal CK. The clock signal CLK is applied to the control terminals CK of the first switch 113 and the second switch 116.

In FIG. 18, the first switch 113 is a PMOS type and the second switch 116 is a NMOS type. In this case, the D flip-flop 40 corresponds to a rising-edge-triggered D flip-flop.

When the clock signal CLK applied to the control terminal CK is the logic low level, the output of the D flip-flop 40 of FIG. 18 is the value of the previous data, that is, the D flip-flop 40 is in a memory state. In the memory state, the output is not changed though the logic value at the data terminal D is changed. The value of the data terminal D is inverted by the second inverter 112 to transfer the inverted value to the output node N1 but the inverted value is not transferred to the output terminals Q and QB of the D flip-flop 40 because the second switch 116 is turned off.

When the clock signal CLK transitions to the logic high level, that is, at the rising edge of the clock signal CLK, the value at the output node N1 of the second inverter 112 is latched by the first inverter 111 and the second inverter 112 when the first switch 113 is turned off. The value at the output node N1 is transferred through the second switch 116 and inverted again by the fourth inverter 115. Thus the data value triggered at the rising edge of the clock signal CLK is transferred to the non-inversion output terminal Q and the inverted data value is transferred to the inversion output terminal QB.

When the clocks signal CLK transitions to the logic low level, that is, at the falling edge of the clock signal CLK, the second switch 116 is turned off and the previous output value is latched by the third inverter 114 and the fourth inverter 115 and stored in the output terminals Q and QB. At the same time, the first switch 113 is turned on and the inverted value of the new data is transferred by the second inverter 112 to the output node N1.

The flip-flop having the logic state changing in synchronization with the edge of the signal applied to the control terminal CK may be referred to as an edge-triggered flip-flop. The D flip-flop 40 of FIG. 18 corresponds to a rising-edge triggered D flip-flop. The rising-edge triggered D flip-flop may toggle per rising edge of the clock signal CLK to invert the memory state from the logic high value to the logic low value or from the logic low value to the logic high value.

If the first switch 113 is an NMOS type and the second switch 116 is a PMOS type, the D flip-flop 40 may be implemented as a falling-edge-triggered D flip-flop. Also the falling-edge-triggered D flip-flop may be implemented if the inverted signal is applied to the control terminal instead of changing the types of the switches 113 and 116.

Using such toggling flip-flops, the first demodulation clock signal CKX and the second demodulation clock signal CKY having the phase difference of 90 degrees may be generated.

Figure 19:
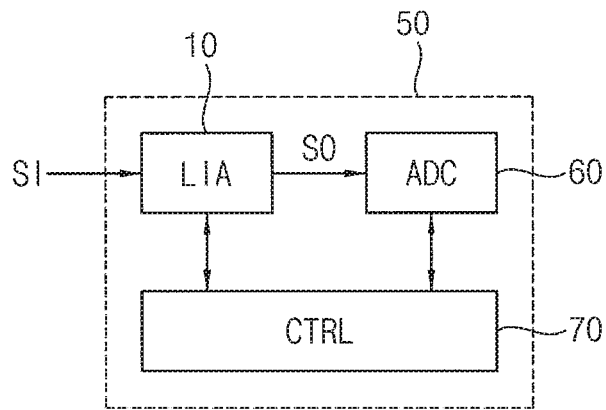
FIG. 19 is a block diagram illustrating an integrated circuit including a lock-in amplifier according to example embodiments.

FIG. 19 is a block diagram illustrating an integrated circuit including a lock-in amplifier according to example embodiments.

Referring to FIG. 19, an integrated circuit 50 may include a lock-in amplifier LIA 10, an analog-to-digital converter ADC 60 and a controller CTRL 70.

The integrated circuit 50 of FIG. 19 may be a semiconductor integrated circuit that is integrated in a single semiconductor die. The integrated circuit 50 may be packages as a single chip.

The lock-in amplifier 10 may receive an input signal SI and generate an output signal SO. The output signal SO may be a voltage signal having voltage levels according to operation modes. As described with reference to FIGS. 1 through 18, the lock-in amplifier 10 may include a clock signal generator and the detector. The clock signal generator may generate a first demodulation clock signal and a second demodulation clock signal having a phase difference of 90 degrees and a same demodulation frequency. The detector may, based on the input signal, the first demodulation clock signal and the second demodulation clock signal, provide an offset voltage corresponding to an offset of the lock-in amplifier in a first operation mode and provide a first output voltage and a second output voltage each corresponding to a demodulation frequency component of the input signal in a second operation mode.

The analog-to-digital converter 60 may convert the offset voltage, the first output voltage and the second output voltage to digital values respectively. The analog-to-digital converter 60 may sample the output signal SO at proper timings under the control of the controller 70. As illustrated in the timing diagrams of FIGS. 9 and 12, a stabilization time for which the first output voltage VOX and the second output voltage VOY are stabilize to the substantial DC voltages may be required according to the time constant of the low pass filter. The controller 70 may consider the stabilization time and determine the sampling timings of the output signal SO of the lock-in amplifier 10. In some example embodiments, the output signal SO may be sampled by the analog-to-digital converter 60 multiple times during a predetermined or, alternatively, desired time interval after the stabilization time and an average filtering may be performed such that the average of the sampled values is used as the output.

The controller 70 may control the lock-in amplifier 10 and the analog-to-digital converter 60 and calculate a magnitude of the demodulation frequency component of the input signal SI based on the digital values. For such calculation, the controller 70 may include a microprocessor, an embedded memory, etc. For example, the above-mentioned mode signal MD may be provided from the controller 70. In some example embodiments, the lock-in amplifier 10 may have the configuration of the single signal channel as described with reference to FIGS. 6 and 9 and the controller 70 may calculate the magnitude Vo of the demodulation frequency component of the input signal SI by Expression 5. In other example embodiments, the lock-in amplifier 10 may have the configuration of the double signal channels as described with reference to FIGS. 11 and 12 and the controller 70 may calculate the magnitude Vo of the demodulation frequency component of the input signal SI by Expression 10

As such, the lock-in amplifier and the integrated circuit including the lock-in amplifier according to example embodiments may detect the two perpendicular components, that is, the in-phase component and the quadrature component using the two demodulation clock signals having the phase difference of 90 degrees regardless of the phase of the input signal and calculate the demodulation frequency component of the input signal based on the two detected components. Thus the conventional circuit such as the tunable phase shifting circuit and the feedback circuit for phase lock-in may be removed or omitted and size and power consumption of the lock-in amplifier may be reduced. In addition, the lock-in amplifier and the integrated circuit including the lock-in amplifier according to example embodiments may extract the offset voltage in the lock-in amplifier to provide the exact magnitude of the demodulation frequency component of the input signal.

Figure 20:
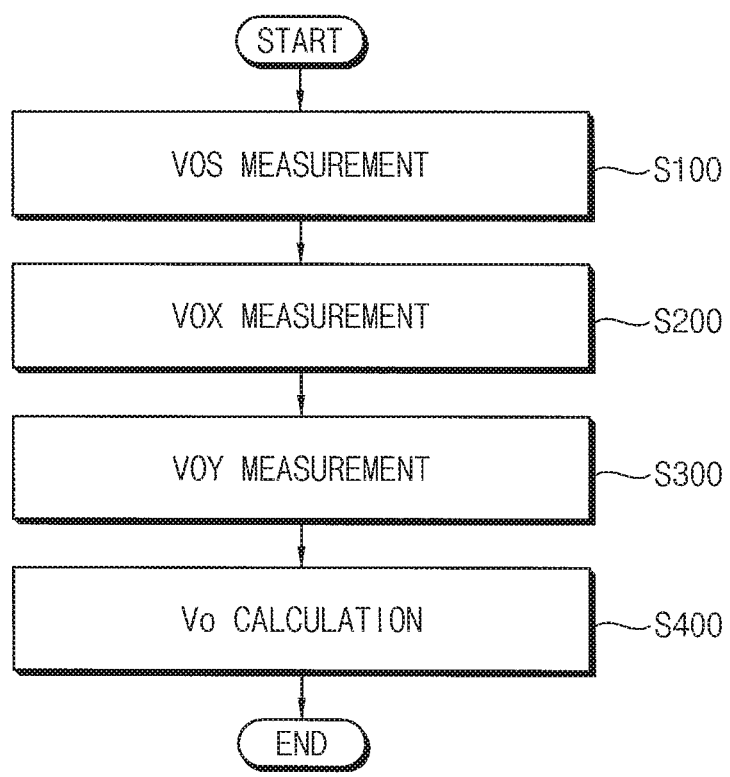
FIG. 20 is a flow chart illustrating a method of measuring a signal according to example embodiments.

FIG. 20 is a flow chart illustrating a method of measuring a signal according to example embodiments.

Referring to FIGS. 1, 2, 19 and 20, the lock-in amplifier 10 in the integrated circuit 50 may measure the offset voltage VOS (S100). As described above, the offset voltage VOS may correspond to the voltage level of the output signal SO when the input signal SI is blocked from being applied to the lock-in amplifier 10. In addition, the lock-in amplifier 10 may measure the first output voltage VOX and the second output voltage VOY (S200, S300). As described above, the first output voltage VOX may correspond to the voltage level of the output signal SO when the input signal SI is mixed or multiplied with the first demodulation clock signal CKX and the second output voltage VOY may correspond to the voltage level of the output signal SO when the input signal SI is mixed or multiplied with the second demodulation clock signal CKY.

The analog-to-digital converter 60 may convert the measured analog voltages to the digital values. The controller 70 in the integrated circuit 50 may calculate the magnitude Vo of the demodulation frequency component of the input signal SI based on the digital values (S400). The calculation of the magnitude Vo of the demodulation frequency component are the same as described with reference to Expression 1 through Expression 10.

FIG. 20 illustrates the offset voltage VOS, the first output voltage VOX, and the second output voltage VOY being measured sequentially. However, according to at least some example embodiments of the inventive concepts, the order of measuring the voltages may be changed variously. For example, when the configuration of the double signal channels is adopted, the first output voltage VOX and the second output voltage VOY may be measured simultaneously.

Figure 21:
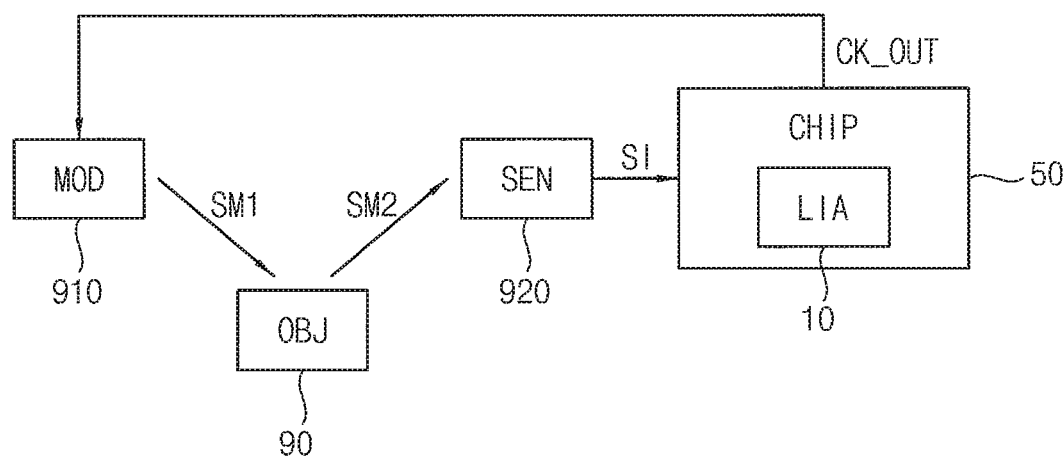
FIG. 21 is a block diagram illustrating a portable measurement device including a lock-in amplifier according to example embodiments.

FIG. 21 is a block diagram illustrating a portable measurement device including a lock-in amplifier according to example embodiments.

Referring to FIG. 21, a portable measurement device 900 may include a modulator MOD 910, a sensor SEN 920 and an integrated circuit chip 50. Also an object OBJ 90 is illustrated in FIG. 21.

The modulator 910 may generate a modulation signal SM1 based on a modulation clock signal CK_OUT. For example, the modulation clock signal CK_OUT may be provided from the integrated circuit chip 50. In some example embodiments, the modulator 910 may implemented with a laser diode and the sensor 920 may be implemented with a photodiode. In this case, the signal SM2 input to the sensor 920 may include a transmitted wave, a reflected wave, a refracted wave, a scattered wave, etc. by the object 90.

The sensor 920 may generate a voltage signal or a current signal as an input signal SI by sensing the signal SM2 that is generated by an interaction of the modulation signal SM1 with the object 90. When the input signal SI is a current signal, the integrated circuit chip 50 may include a current-to-voltage converter for converting the current signal to a voltage signal to provide the voltage signal to the lock-in amplifier 10.

As described above with respect to FIG. 19, the integrated circuit chip 50 may include the lock-in amplifier LIA 10, the analog-to-digital converter ADC 60 and the controller CTRL 70. As described with reference to FIGS. 1 through 18, the lock-in amplifier 10 may include a clock signal generator and the detector. The clock signal generator may generate a first demodulation clock signal and a second demodulation clock signal having a phase difference of 90 degrees and a same demodulation frequency. The detector may, based on the input signal, the first demodulation clock signal and the second demodulation clock signal, provide an offset voltage corresponding to an offset of the lock-in amplifier in a first operation mode and provide a first output voltage and a second output voltage, each corresponding to a demodulation frequency component of the input signal, in a second operation mode. The analog-to-digital converter 60 may convert the offset voltage, the first output voltage, and the second output voltage to digital values respectively. The controller 70 may control the lock-in amplifier 10 and the analog-to-digital converter 60 and calculate a magnitude of the demodulation frequency component of the input signal SI based on the digital values.

At least one of the first demodulation clock signal CKX and the second demodulation clock signal CKY may be provided as the modulation clock signal CK_OUT to the modulator 910.

The portable measurement device 900 may be an arbitrary device requiring small size and low power consumption. For example, the portable measurement device 900 may be a glucose meter, a blood pressure meter, an electronic noise detector, etc.

As such, the lock-in amplifier, the integrated circuit and the portable measurement device including the lock-in amplifier according to example embodiments may detect the two perpendicular components, that is, the in-phase component and the quadrature component using the two demodulation clock signals having the phase difference of 90 degrees regardless of the phase of the input signal and calculate the demodulation frequency component of the input signal based on the two detected components. Thus the conventional circuit such as the tunable phase shifting circuit and the feedback circuit for phase lock-in may be removed or omitted and size and power consumption of the lock-in amplifier may be reduced. In addition, the lock-in amplifier, the integrated circuit and the portable measurement device including the lock-in amplifier according to example embodiments may extract the offset voltage in the lock-in amplifier to provide the exact magnitude of the demodulation frequency component of the input signal.

Figure 22:
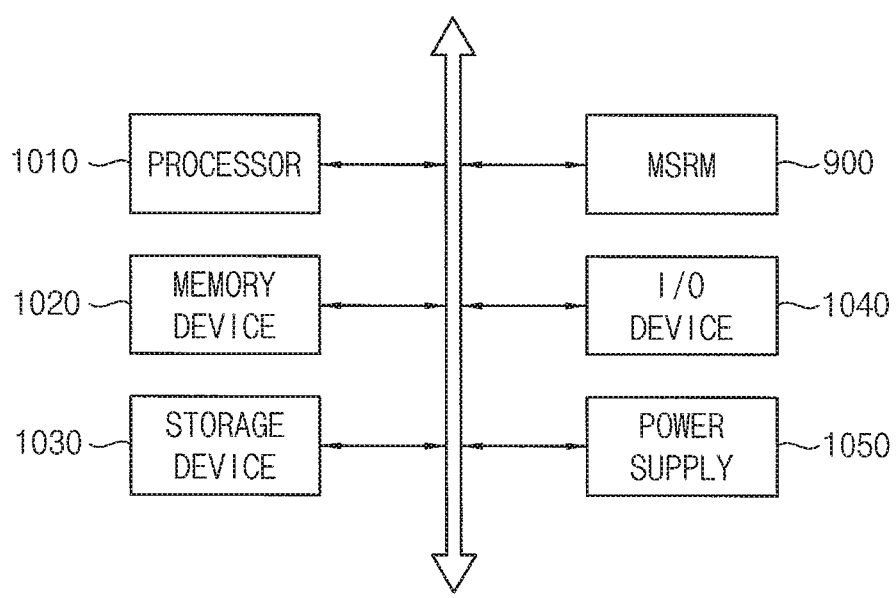
FIG. 22 is a block diagram illustrating a computing system including a measurement device according to example embodiments.

FIG. 22 is a block diagram illustrating a computing system including a measurement device according to example embodiments.

Referring to FIG. 22, a computing system 1000 may include a processor 1010, a memory device 1020, a storage device 1030, an input-output (I/O) device 1040, a power supply 1050, and a signal measurement device 900. Although it is not illustrated in FIG. 22, the computing system 1000 may further include ports that communicate with a video card, a sound card, a memory card, a universal serial bus (USB) device, and/or other electronic devices.

The processor 1010 may perform various calculations or tasks. According to some embodiments, the processor 1010 may be a microprocessor or a central processing unit (CPU). The processor 1010 may communicate with the memory device 1020, the storage device 1030, and the input/output device 1040 via an address bus, a control bus, and/or a data bus. In some example embodiments, the processor 1010 may be coupled to an extended bus, such as a peripheral component interconnection (PCI) bus. The memory device 1020 may store data for operating the computing system 1000. For example, the memory device 1020 may be implemented with a dynamic random access memory (DRAM) device, a mobile DRAM device, a static random access memory (SRAM) device, a phase random access memory (PRAM) device, a ferroelectric random access memory (FRAM) device, a resistive random access memory (RRAM) device, and/or a magnetic random access memory (MRAM) device, for example. The storage device may include a solid state drive (SSD), a hard disk drive (HDD), a compact-disc read-only memory (CD-ROM), etc. The input/output device 1040 may include an input device (for example, a keyboard, a keypad, a mouse, etc.) and an output device (for example, a printer, a display device, etc.). The power supply 1050 supplies operation voltages for the computing system 1000.

The signal measurement device may include a lock-in amplifier according to example embodiments as described with reference to FIGS. 1 through 18. The lock-in amplifier and the signal measurement device 900 including the lock-in amplifier may detect the two perpendicular components, that is, the in-phase component and the quadrature component using the two demodulation clock signals having the phase difference of 90 degrees regardless of the phase of the input signal and calculate the demodulation frequency component of the input signal based on the two detected components. Thus the conventional circuit such as the tunable phase shifting circuit and the feedback circuit for phase lock-in may be removed or omitted and size and power consumption of the lock-in amplifier may be reduced. In addition, the lock-in amplifier, the integrated circuit and the portable measurement device including the lock-in amplifier according to example embodiments may extract the offset voltage in the lock-in amplifier to provide the exact magnitude of the demodulation frequency component of the input signal.

The computing system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), or wafer-level processed stack package (WSP), for example.

The computing system 1000 may be any computing system including a lock-in amplifier according to example embodiments. For example, the computing system 1000 may include a digital camera, a mobile phone, a smart phone, a portable multimedia player (PMP), a personal digital assistant (PDA), etc.

Figure 23:
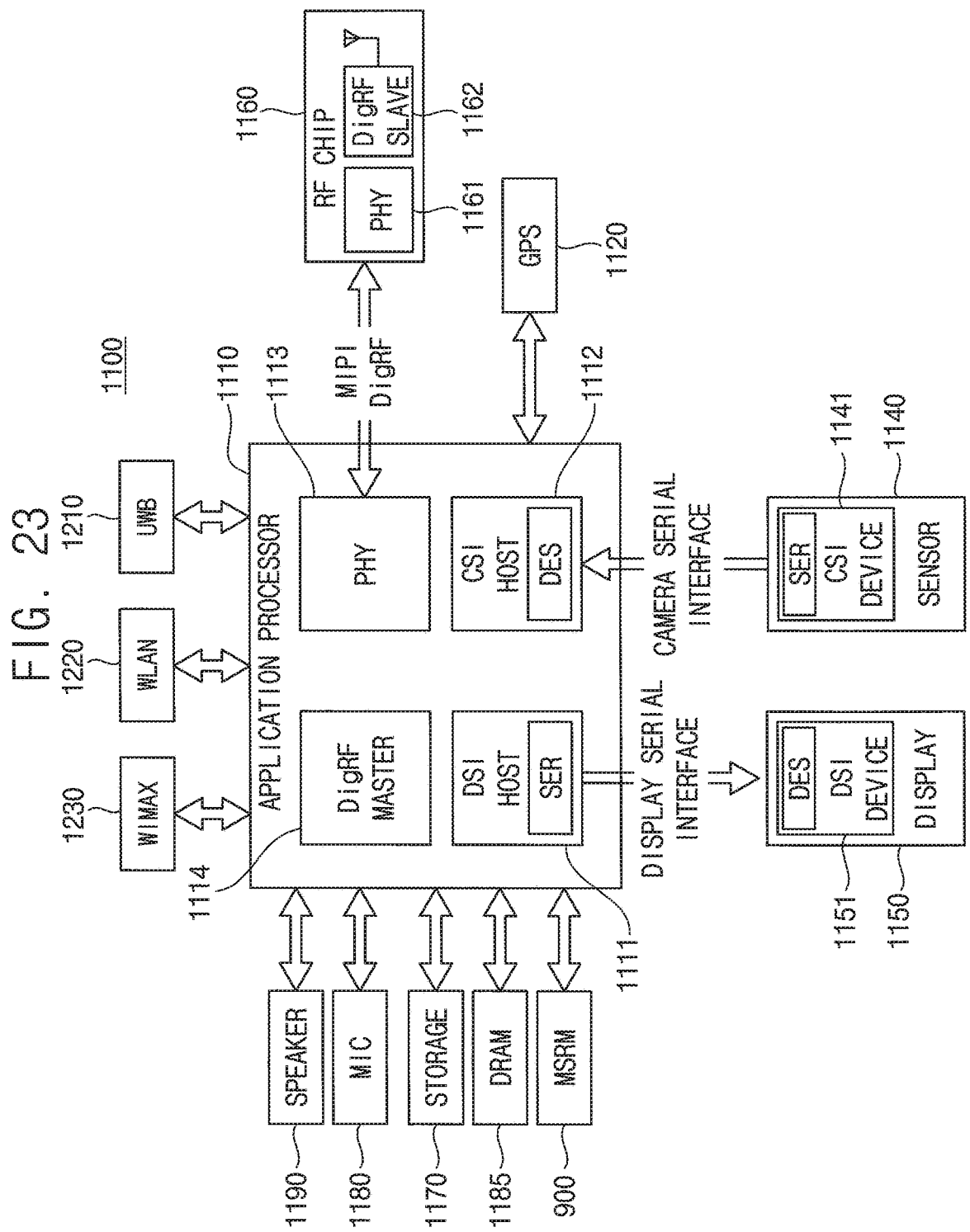
FIG. 23 illustrates a block diagram of an interface employable in the computing system of FIG. 22 according to some example embodiments.

FIG. 23 illustrates a block diagram of an interface employable in the computing system of FIG. 22 according to some example embodiments.

Referring to FIG. 23, a computing system 1100 may be implemented by a data processing device that uses or supports a mobile industry processor interface (MIPI®) interface. The computing system 1100 may include an application processor 1110, an image sensor 1140, a display device 1150, etc. A CSI host 1112 of the application processor 1110 may perform a serial communication with a CSI device 1141 of the three-dimensional image sensor 1140 via a camera serial interface (CSI). In some example embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI).

In some example embodiments, the DSI host 1111 may include a serializer (SER), and the DSI device 1151 may include a deserializer (DES). The computing system 1100 may further include a radio frequency (RF) chip 1160 performing a communication with the application processor 1110 and a DigRFSM slave 1162 providing communication with other devices. A physical layer (PHY) 1113 of the computing system 1100 and a physical layer (PHY) 1161 of the RF chip 1160 may perform data communications based on a MIPI® DigRFSM. The application processor 1110 may further include a DigRFSM MASTER 1114 that controls the data communications of the PHY 1161.

The computing system 1100 may further include a global positioning system (GPS) 1120, a storage 1170, a MIC 1180, a DRAM device 1185, and a speaker 1190. In addition, the computing system 1100 may perform communications using an ultra-wideband (UWB) 1210, a wireless local area network (WLAN) 1220, a worldwide interoperability for microwave access (WIMAX) 1230, etc. However, the structure and the interface of the computing system 1100 are not limited thereto.

As described above, the lock-in amplifier, the integrated circuit and the portable measurement device including the lock-in amplifier according to example embodiments may detect the two perpendicular components (i.e., the in-phase component and the quadrature component) using the two demodulation clock signals having the phase difference of 90 degrees regardless of the phase of the input signal and calculate the demodulation frequency component of the input signal based on the two detected components. Thus the conventional circuit such as the tunable phase shifting circuit and the feedback circuit for phase lock-in may be removed or omitted and size and power consumption of the lock-in amplifier may be reduced. The size and the power consumption of the lock-in amplifier may be further reduced and the lock-in amplifier may be adopted efficiently in the portable measurement device by providing the demodulation clock signals having the phase difference of 90 degrees using a plurality of flip-flops.

In addition, the lock-in amplifier, the integrated circuit and the portable measurement device including the lock-in amplifier according to example embodiments may extract the offset voltage in the lock-in amplifier to provide the exact magnitude of the demodulation frequency component of the input signal.

Further the lock-in amplifier, the integrated circuit and the portable measurement device including the lock-in amplifier according to example embodiments may generate the first output voltage and the second output voltage sequentially per operation mode (e.g., based on operation mode) using a single signal channel including a one mixer, thereby preventing mismatch between multiple channels and providing the exact magnitude of the demodulation frequency component of the input signal.

At least some example embodiments of the inventive concepts may be applied to a signal measurement device and a system including the signal measurement device requiring small size and low power consumption. For example, at least some example embodiments of the inventive concepts may be applied to a signal measurement device such as a glucose meter, a blood pressure meter, an electronic nose and a portable electronic device including the signal measurement device such as a cellular phone, a smart phone, a wearable device, etc.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A lock-in amplifier comprising:
   a clock signal generator configured to generate a first demodulation clock signal and a second demodulation clock signal having a phase difference of 90 degrees and a same demodulation frequency; and
   a detector configured to, based on an input signal, the first demodulation clock signal, and the second demodulation clock signal,
     provide an offset voltage corresponding to an offset of the lock-in amplifier in a first operation mode, and
     provide a first output voltage and a second output voltage, each of which correspond to a demodulation frequency component of the input signal in a second operation mode,
   wherein the detector includes at least one mixer and generates the offset voltage, the first output voltage and the second output voltage based on an operation mode using the at least one mixer.

2. The lock-in amplifier of claim 1, wherein the detector includes a mixer and the demodulation frequency component of the input signal is determined by $$Vo=[(VOX-VOS)^2+(VOY-VOS)^2]^{1/2},$$

where Vo is an output of the lock-in amplifier corresponding to the demodulation frequency component, VOX is the first output voltage, VOY is the second output voltage and VOS is the offset voltage.

3. The lock-in amplifier of claim 1, wherein the detector includes a first mixer and a second mixer, and is configured to, generate a first offset voltage and a second offset voltage,
generate the first offset voltage and the first output voltage sequentially based on an operation mode using the first mixer, and
generate the second offset voltage and the second output voltage sequentially based on an operation mode using the second mixer.

4. The lock-in amplifier of claim 3, wherein the demodulation frequency component of the input signal is determined by $$Vo=[(VOX-VOSX)^2+(VOY-VOSY)^2]^{1/2},$$

where Vo is an output of the lock-in amplifier corresponding to the demodulation frequency component, VOX is the first output voltage, VOY is the second output voltage, VOSX is the first offset voltage, and VOSY is the second offset voltage.

5. The lock-in amplifier of claim 1, wherein the detector comprises:
an amplification circuit configured to amplify the input signal to output an amplified signal in the second operation mode;
a mixing circuit configured to,
multiply the amplified signal and the first demodulation clock signal to output a first rectified signal in the second operation mode, and
multiply the amplified signal and the second demodulation clock signal to output a second rectified signal in the second operation mode; and
a filtering circuit configured to,
filter the first rectified signal to generate the first output voltage in the second operation mode, and
filter the second rectified signal to generate the second output voltage in the second operation mode.

6. The lock-in amplifier of claim 5, wherein the mixing circuit comprises:
a mixer, the mixer including,
a first input terminal configured to receive the amplified signal,
a second input terminal configured to receive the first demodulation clock signal and the second demodulation clock signal sequentially in the second operation mode, and
an output terminal configured to output the first rectified signal and the second rectified signal sequentially in the second operation mode.

7. The lock-in amplifier of claim 6, wherein the filtering circuit comprises:
a low pass filter connected to the output terminal of the mixer and configured to output the first output voltage and the second output voltage sequentially in the second operation mode.

8. The lock-in amplifier of claim 6, further comprising:
a clock selector configured to select one of the first demodulation clock signal and the second demodulation clock signal to provide a selected demodulation clock signal to the second input terminal of the mixer.

9. The lock-in amplifier of claim 5, wherein the mixing circuit comprises:
a first mixer, the first mixer including,
a first input terminal configured to receive the amplified signal,
a second input terminal configured to receive the first demodulation clock signal, and
a first output terminal configured to output the first rectified signal; and a second mixer, the second mixer including,
a third input terminal configured to receive the amplified signal,
a fourth input terminal configured to receive the second demodulation clock signal, and
a second output terminal configured to output the second rectified signal.

10. The lock-in amplifier of claim 9, wherein the filtering circuit includes:
a first low pass filter connected to the first output terminal and configured to output a first offset voltage in the first operation mode and output the first output voltage in the second operation mode; and
a second low pass filter connected to the second output terminal and configured to output a second offset voltage in the first operation mode and output the second output voltage in the second operation mode.

11. The lock-in amplifier of claim 5, wherein the detector further comprises:
an input circuit configured to block the input signal from being applied to the amplification circuit in the first operation mode in response to a mode signal.

12. The lock-in amplifier of claim 11, wherein the filtering circuit is configured to generate the offset voltage while the input signal is blocked by the input circuit from being applied to the amplification circuit.

13. The lock-in amplifier of claim 1, wherein the clock signal generator includes:
a plurality of flip-flops configured to generate the first demodulation clock signal and the second demodulation clock signal based on a reference clock signal having a frequency corresponding to N times the demodulation frequency, where N is a natural number.

14. The lock-in amplifier of claim 1, wherein the clock signal generator includes:
a first flip-flop, the first flip-flop including,
a clock terminal configured to receive a reference clock signal,
a non-inversion output terminal configured to generate a first clock signal,
an inversion output terminal configured to generate a second clock signal, and
a data terminal connected to the inversion output terminal of the first flip-flop;
a second flip-flop, the second flip-flop including,
a clock terminal configured to receive the first clock signal,
a non-inversion output terminal configured to generate the first demodulation clock signal,
an inversion output terminal, and
a data terminal connected to the inversion output terminal of the second flip-flop; and
a third flip-flop, the third flip-flop including,
a clock terminal configured to receive the second clock signal,
a non-inversion output terminal configured to generate the second demodulation clock signal,
an inversion output terminal, and
a data terminal connected to the inversion output terminal of the third flip-flop.

15. The lock-in amplifier of claim 14, wherein a frequency of the reference clock signal is four times the demodulation frequency.

16. The lock-in amplifier of claim 1, wherein the clock signal generator includes:
a first flip-flop, the first flip-flop including,
a clock terminal configured to receive a reference clock signal, a non-inversion output terminal configured to generate the first demodulation clock signal,
an inversion output terminal, and
a data terminal connected to the inversion output terminal of the first flip-flop; and
a second flip-flop, the second flip-flop including,
a clock terminal configured to receive an inversion signal of the reference clock signal,
a non-inversion output terminal configured to generate the second demodulation clock signal,
an inversion output terminal, and
a data terminal connected to the inversion output terminal of the second flip-flop.

17. The lock-in amplifier of claim 16, wherein a frequency of the reference clock signal is two times the demodulation frequency.

18. A portable measurement circuit comprising:
a modulator configured to generate a modulation signal based on a modulation clock signal;
a sensor configured to generate an input signal by sensing a signal that is generated by an interaction of the modulation signal with an object;
a clock signal generator configured to generate a first demodulation clock signal and a second demodulation clock signal having a phase difference of 90 degrees and a same demodulation frequency;
a detector configured to, based on the input signal, the first demodulation clock signal and the second demodulation clock signal,
provide an offset voltage corresponding to an offset in a first operation mode, and
provide a first output voltage and a second output voltage, each of which correspond to a demodulation frequency component of the input signal in a second operation mode;
an analog-to-digital converter configured to convert the offset voltage, the first output voltage and the second output voltage to digital values, respectively; and
a controller configured to,
control the clock signal generator, the detector and the analog-to-digital converter, and
calculate a magnitude of the demodulation frequency component of the input signal based on the digital values.

19. A lock-in amplifier comprising:
a clock signal generator configured to generate a first demodulation clock signal and a second demodulation clock signal such that the first demodulation clock signal and a second demodulation clock signal have a phase difference of 90 degrees and have a same frequency; and
a detector including an amplification circuit, the detector being configured to,
receive an input signal,
generate an offset voltage while the lock-in amplifier is in a first operation mode, and
use the input signal, the first demodulation clock signal, and the second demodulation clock signal to generate a first output voltage and a second output voltage while the lock-in amplifier is in a second operation mode such that the first output voltage and a second output voltage both correspond to a demodulation frequency component of the input signal,
the detector being configured to block the input signal from being provided to the amplification circuit while the lock-in amplifier is in the first operation mode such that the offset voltage is a voltage output by the detector while the input signal is blocked.

* * * * *